US011867944B2

(12) United States Patent
Meade et al.

(10) Patent No.: US 11,867,944 B2
(45) Date of Patent: Jan. 9, 2024

(54) PHOTONIC SYSTEMS TO ENABLE TOP-SIDE WAFER-LEVEL OPTICAL AND ELECTRICAL TEST

(71) Applicant: Ayar Labs, Inc., Santa Clara, CA (US)

(72) Inventors: Roy Edward Meade, Lafayette, CA (US); Chen Sun, Berkeley, CA (US); Shahab Ardalan, Santa Clara, CA (US); John Fini, Albany, CA (US); Forrest Sedgwick, Santa Clara, CA (US)

(73) Assignee: Ayar Labs, Inc., Santa Clara, CA (US)

(*) Notice: Subject to any disclaimer, the term of this patent is extended or adjusted under 35 U.S.C. 154(b) by 0 days.

(21) Appl. No.: 17/701,072

(22) Filed: Mar. 22, 2022

(65) Prior Publication Data

US 2022/0214497 A1 Jul. 7, 2022

Related U.S. Application Data

(63) Continuation of application No. 16/856,387, filed on Apr. 23, 2020, now Pat. No. 11,280,959.

(60) Provisional application No. 62/837,723, filed on Apr. 23, 2019.

(51) Int. Cl.
  *G02B 6/13* (2006.01)
  *G02B 6/12* (2006.01)
  *H01L 21/66* (2006.01)
  *G01M 11/00* (2006.01)

(52) U.S. Cl.
  CPC ......... *G02B 6/12004* (2013.01); *G01M 11/31* (2013.01); *G02B 6/13* (2013.01); *H01L 22/20* (2013.01); *H01L 22/30* (2013.01); *G02B 2006/12107* (2013.01); *G02B 2006/12121* (2013.01); *G02B 2006/12145* (2013.01); *G02B 2006/12147* (2013.01); *G02B 2006/12164* (2013.01)

(58) Field of Classification Search
  CPC .............................. G01R 31/1218; G02B 6/13
  See application file for complete search history.

(56) References Cited

U.S. PATENT DOCUMENTS

| 5,490,226 A * | 2/1996 | Nelson | G02F 1/3138 |
| | | | 385/39 |
| 7,262,852 B1 * | 8/2007 | Gunn, III | G02B 6/29311 |
| | | | 250/559.4 |
| 8,742,782 B2 * | 6/2014 | Ouyang | G01R 31/31728 |
| | | | 324/762.01 |

(Continued)

*Primary Examiner* — Charlie Y Peng
(74) *Attorney, Agent, or Firm* — Penilla IP, APC

(57) ABSTRACT

An intact semiconductor wafer (wafer) includes a plurality of die. Each die has a top layer including routings of conductive interconnect structures electrically isolated from each other by intervening dielectric material. A top surface of the top layer corresponds to a top surface of the wafer. Below the top layer, each die has a device layer including optical devices and electronic devices. Each die has a cladding layer below the device layer and on a substrate of the wafer. Each die includes a photonic test port within the device layer. For each die, a light transfer region is formed within the intact wafer to extend through the top layer to the photonic test port within the device layer. The light transfer region provides a window for transmission of light into and out of the photonic test port from and to a location on the top surface of the wafer.

17 Claims, 10 Drawing Sheets

(56) References Cited

U.S. PATENT DOCUMENTS

| | | | | |
|---|---|---|---|---|
| 9,766,410 B1* | 9/2017 | Chen | ............... | G02B 6/124 |
| 2005/0194990 A1* | 9/2005 | Gothoskar | ............... | G02B 6/34 |
| | | | | 324/754.23 |
| 2018/0313718 A1* | 11/2018 | Traverso | ............... | G02B 6/305 |
| 2020/0124792 A1* | 4/2020 | Cho | ............... | H01L 27/144 |

* cited by examiner

1101

Having a wafer that includes a plurality of die formed on the wafer, with the wafer in an intact configuration; the wafer having a top surface and a bottom surface; each of the plurality of die having a top layer that includes routings of conductive interconnect structures electrically isolated from each other by intervening dielectric material; a top surface of the top layer corresponding to the top surface of the wafer; each of the plurality of die having a device layer located below the top layer; the device layer including optical devices and electronic devices; each of the plurality of die having a cladding layer formed below the device layer; the cladding layer having a refractive index different than a refractive index of optical waveguides formed within the device layer; the cladding layer formed on a substrate of the wafer; each of the plurality of die including a respective portion of the substrate; a bottom surface of the substrate portion of each die corresponding to the bottom surface of the wafer; each of the plurality of die including a photonic test port formed within the device layer.

1103

Forming a light transfer region within the wafer, with the wafer in the intact configuration; the light transfer region formed to extend through the top layer to the photonic test port within the device layer; the light transfer region providing a window for transmission of light into and out of the photonic test port from and to a location on the top surface of the wafer.

Fig. 11

PHOTONIC SYSTEMS TO ENABLE TOP-SIDE WAFER-LEVEL OPTICAL AND ELECTRICAL TEST

CLAIM OF PRIORITY

This application is a continuation application under 35 U.S.C. 120 of prior U.S. Non-Provisional Application Ser. No. 16/856,387, filed on Apr. 23, 2020, issued as U.S. Pat. No. 11,280,959, on Mar. 22, 2022, which claims priority under 35 U.S.C. 119(e) to U.S. Provisional Patent Application No. 62/837,723, filed Apr. 23, 2019. The disclosure of each above-identified application is incorporated herein by reference in its entirety for all purposes.

BACKGROUND

Optical data communication systems operate by modulating laser light to encode digital data patterns. The modulated laser light is transmitted through an optical data network from a sending node to a receiving node. The modulated laser light having arrived at the receiving node is de-modulated to obtain the original digital data patterns. Therefore, implementation and operation of optical data communication systems is dependent upon having reliable and efficient photonic devices manufactured within semiconductor chips at different nodes within the optical data network. In this regard, it is necessary to test photonic devices and associated electronic devices within the semiconductor chips prior to deploying the semiconductor chips for use in the optical data network. It is within this context that the present invention arises.

SUMMARY

In an example embodiment, a semiconductor wafer is disclosed. A plurality of die are formed on the semiconductor wafer. The semiconductor wafer is in an intact configuration. The semiconductor wafer has a top surface and a bottom surface. Each of the plurality of die has a top layer that includes routings of conductive interconnect structures electrically isolated from each other by intervening dielectric material. A top surface of the top layer corresponds to the top surface of the semiconductor wafer. Each of the plurality of die has a device layer located below the top layer. The device layer includes optical devices and electronic devices. Each of the plurality of die has a cladding layer formed below the device layer. The cladding layer has a refractive index different than a refractive index of optical waveguides formed within the device layer. The cladding layer is formed on a substrate of the semiconductor wafer. Each of the plurality of die includes a respective portion of the substrate. A bottom surface of the substrate corresponds to the bottom surface of the semiconductor wafer. Each of the plurality of die includes a photonic test port within the device layer. The semiconductor wafer also includes a light transfer region formed within the semiconductor wafer, with the semiconductor wafer in the intact configuration. The light transfer region extends through the top layer to the photonic test port within the device layer. The light transfer region provides a window for transmission of light into and out of the photonic test port from and to a location on the top surface of the semiconductor wafer.

In an example embodiment, a method is disclosed for enabling wafer-level photonic testing. The method includes having a semiconductor wafer that includes a plurality of die formed on the semiconductor wafer. The semiconductor wafer is in an intact configuration. The semiconductor wafer has a top surface and a bottom surface. Each of the plurality of die has a top layer that includes routings of conductive interconnect structures electrically isolated from each other by intervening dielectric material. A top surface of the top layer corresponds to the top surface of the semiconductor wafer. Each of the plurality of die has a device layer located below the top layer. The device layer includes optical devices and electronic devices. Each of the plurality of die has a cladding layer formed below the device layer. The cladding layer has a refractive index different than a refractive index of optical waveguides formed within the device layer. The cladding layer is formed on a substrate of the semiconductor wafer. Each of the plurality of die includes a respective portion of the substrate. A bottom surface of the substrate corresponds to the bottom surface of the semiconductor wafer. Each of the plurality of die includes a photonic test port within the device layer. The method also includes forming a light transfer region within the semiconductor wafer, with the semiconductor wafer in the intact configuration. The light transfer region is formed to extend through the top layer to the photonic test port within the device layer. The light transfer region provides a window for transmission of light into and out of the photonic test port from and to a location on the top surface of the semiconductor wafer.

In an example embodiment, a semiconductor wafer is disclosed. A plurality of die are formed on the semiconductor wafer. The semiconductor wafer is in an intact configuration. The semiconductor wafer has a top surface and a bottom surface. Each of the plurality of die has a top layer that includes routings of conductive interconnect structures electrically isolated from each other by intervening dielectric material. A top surface of the top layer corresponds to the top surface of the semiconductor wafer. Each of the plurality of die has a device layer located below the top layer. The device layer includes optical devices and electronic devices. Each of the plurality of die has a cladding layer formed below the device layer. The cladding layer has a refractive index different than a refractive index of optical waveguides formed within the device layer. The cladding layer is formed on a substrate of the semiconductor wafer. Each of the plurality of die includes a respective portion of the substrate. A bottom surface of the substrate corresponds to the bottom surface of the semiconductor wafer. The device layer of each of the plurality of die includes a first photonic test port, a second photonic test port, a first normal vertical optical grating coupler, and a second normal vertical optical grating coupler. For each of the plurality of die, a first light transfer region is formed within the semiconductor wafer, with the semiconductor wafer in the intact configuration. The first light transfer region extends through the top layer to the first photonic test port within the device layer. The first light transfer region provides a window for transmission of light into and out of the first photonic test port from and to a first location on the top surface of the semiconductor wafer. For each of the plurality of die, a second light transfer region is formed within the semiconductor wafer, with the semiconductor wafer in the intact configuration. The second light transfer region extends through the top layer to the second photonic test port within the device layer. The second light transfer region provides a window for transmission of light into and out of the second photonic test port from and to a second location on the top surface of the semiconductor wafer. The first photonic test port is switchable with the first normal vertical optical grating coupler within the device layer. The first photonic test port enables wafer-level photonic testing of photonic circuitry coupled to the first normal vertical optical grating coupler. The second photonic test port is switchable with the second normal vertical optical grating coupler within the device layer. The second photonic test port enables wafer-level photonic testing of photonic circuitry coupled to the second normal vertical optical grating coupler.

In an example embodiment, a semiconductor wafer is disclosed. A plurality of die are formed on the semiconductor wafer. The semiconductor wafer is in an intact configuration. The semiconductor wafer has a top surface and a bottom surface. Each of the plurality of die has a top layer that includes routings of conductive interconnect structures electrically isolated from each other by intervening dielectric material. A top surface of the top layer corresponds to the top surface of the semiconductor wafer. Each of the plurality of die has a device layer located below the top layer. The device layer includes optical devices and electronic devices. Each of the plurality of die has a cladding layer formed below the device layer. The cladding layer has a refractive index different than a refractive index of optical waveguides formed within the device layer. The cladding layer is formed on a substrate of the semiconductor wafer. Each of the plurality of die includes a respective portion of the substrate. A bottom surface of the substrate corresponds to the bottom surface of the semiconductor wafer. The device layer of each of the plurality of die includes a photonic test port, a first normal vertical optical grating coupler, a second normal vertical optical grating coupler, and a third normal vertical optical grating coupler. For each of the plurality of die, a light transfer region is formed within the semiconductor wafer, with the semiconductor wafer in the intact configuration. The light transfer region extends through the top layer to the photonic test port within the device layer. The light transfer region provides a window for transmission of light into and out of the photonic test port from and to a location on the top surface of the semiconductor wafer. For each of the plurality of die, a first optical switching device formed within the device layer. The first optical switching device has a first optical port optically connected to an optical input of photonic transmitter circuitry within the device layer. The first optical switching device has a second optical port optically connected to the first normal vertical optical grating coupler within the device layer. The first optical switching device has a third optical port optically connected to the photonic test port within the device layer. The first optical switching device is configured to optically connect its third optical port to its first optical port for wafer-level photonic testing. The first optical switching device is configured to optically connect its second optical port to its first optical port for normal die operation. For each of the plurality of die, a second optical switching device is formed within the device layer. The second optical switching device has a first optical port optically connected to an optical output of the photonic transmitter circuitry within the device layer. The second optical switching device has a second optical port optically connected to the second normal vertical optical grating coupler within the device layer. The second optical switching device has a third optical port optically connected to an optical waveguide within the device layer. The second optical switching device is configured to optically connect its third optical port to its first optical port for wafer-level photonic testing. The second optical switching device is configured to optically connect its second optical port to its first optical port for normal die operation. For each of the plurality of die, a third optical switching device is formed within the device layer. The third optical switching device has a first optical port optically connected to an optical input of photonic receiver circuitry within the device layer. The third optical switching device has a second optical port optically connected to the third normal vertical optical grating coupler within the device layer. The third optical switching device has a third optical port optically connected to the optical waveguide within the device layer. The third optical switching device is configured to optically connect its third optical port to its first optical port for wafer-level photonic testing so that modulated light transmitted through the optical output of the photonic transmitter circuitry is transmitted through the optical waveguide to the optical input of the photonic receiver circuitry during wafer-level photonic testing. The third optical switching device is configured to optically connect its second optical port to its first optical port for normal die operation.

In an example embodiment, a semiconductor wafer is disclosed. A plurality of die are formed on the semiconductor wafer. The semiconductor wafer is in an intact configuration. The semiconductor wafer has a top surface and a bottom surface. Each of the plurality of die has a top layer that includes routings of conductive interconnect structures electrically isolated from each other by intervening dielectric material. A top surface of the top layer corresponding to the top surface of the semiconductor wafer. Each of the plurality of die has a device layer located below the top layer. The device layer includes optical devices and electronic devices. Each of the plurality of die has a cladding layer formed below the device layer. The cladding layer has a refractive index different than a refractive index of optical waveguides formed within the device layer. The cladding layer is formed on a substrate of the semiconductor wafer. Each of the plurality of die includes a respective portion of the substrate. A bottom surface of the substrate corresponds to the bottom surface of the semiconductor wafer. For each of the plurality of die, photonic circuitry is formed within the device layer. The photonic circuitry has a number (N) of optical ports. For each of the plurality of die, a number N of normal vertical optical grating couplers are formed within the device layer. For each of the plurality of die, a number N of optical switching devices are formed within the device layer. Each optical switching device has a first optical port optically connected to a respective one of the number N of optical ports of the photonic circuitry. Each optical switching device has a second optical port optically connected to a respective one of the number N of normal vertical optical grating couplers. Each optical switching device has a third optical port. For each of the plurality of die, a number N of optical waveguides are formed within the device layer. Each of the number N of optical waveguides is optically connected to the third optical port of a respective one of the number N of optical switching devices. For each of the plurality of die, an optical multiplexer is formed within the device layer. The optical multiplexer has a first interface that includes a number N of optical ports. Each optical port of the first interface of the optical multiplexer is optically connected to a respective one of the number N of optical waveguides. The optical multiplexer has a second interface that includes a number (M) of optical ports. The optical multiplexer is programmable to optically connect any one or more of the number N of optical ports of the first interface to any one or more of the number M of optical ports of the second interface at a given time. For each of the plurality of die, a number M of photonic test ports are formed within the device layer. Each of the number M of photonic test ports is optically connected to a respective one of the number M of optical ports of the second interface of the optical multiplexer. For each of the plurality of die, a number M of light transfer regions are formed within the semiconductor wafer, with the semiconductor wafer in the intact configuration. Each of the number M of light transfer regions extends through the top layer to a respective one of the number M of photonic test ports within the device layer. Each of the number M of light transfer regions provides a window for transmission of light into and out of the respective one of the number M of photonic test ports from and to a respective location on the top surface of the semiconductor wafer.

BRIEF DESCRIPTION OF THE DRAWINGS

FIG. 11 shows a flowchart of a method for enabling wafer-level photonic testing, in accordance with some embodiments.

DETAILED DESCRIPTION

In the following description, numerous specific details are set forth in order to provide a thorough understanding of the present invention. It will be apparent, however, to one skilled in the art that the present invention may be practiced without some or all of these specific details. In other instances, well known process operations have not been described in detail in order not to unnecessarily obscure the present invention.

Systems and associated methods are disclosed herein for enabling and performing simultaneous wafer-level optical/photonic and electrical testing of die within a semiconductor wafer. In other words, systems and methods are disclosed herein for enabling and performing both optical/photonic testing and electrical testing of die within a semiconductor wafer, with the semiconductor wafer intact, i.e., non-singulated/non-diced. The term "die" as used herein refers to any type of semiconductor chip, including thin-BOX SOI chips, thick-BOX SOI chips, and/or bulk CMOS chips, among other types of semiconductor chips. Also, for ease of description, the term "wafer" is used hereafter to refer to any type of semiconductor wafer upon which die are manufactured. It should be understood that in various embodiments the wafer can include different numbers of die. The term "light" as used herein refers to electromagnetic radiation within a portion of the electromagnetic spectrum that is usable by optical data communication systems. The term "wavelength" as used herein refers to the wavelength of electromagnetic radiation. In some embodiments, the portion of the electromagnetic spectrum that is usable by optical data communication systems includes light having wavelengths within a range extending from about 1100 nanometers to about 1565 nanometers (covering from the O-Band to the C-Band, inclusively, of the electromagnetic spectrum). However, it should be understood that the portion of the electromagnetic spectrum referred to herein as light can include wavelengths either less than 1100 nanometers or greater than 1565 nanometers, so long as the light is usable by an optical data communication system for encoding, transmission, and decoding of digital data through modulation/de-modulation of the light. In some embodiments, the light used in optical data communication systems has wavelengths in the near-infrared portion of the electromagnetic spectrum. It should be understood that light may be confined to propagate in an optical waveguide, such as (but not limited to) an optical fiber or an optical waveguide within a planar lightwave circuit (PLC). In some embodiments, the light can be polarized. And, in some embodiments, the light has a single wavelength, where the single wavelength can refer to either essentially one wavelength or can refer to a narrow band of wavelengths that can be identified and processed by an optical data communication system as if it were a single wavelength.

Figure 1A:
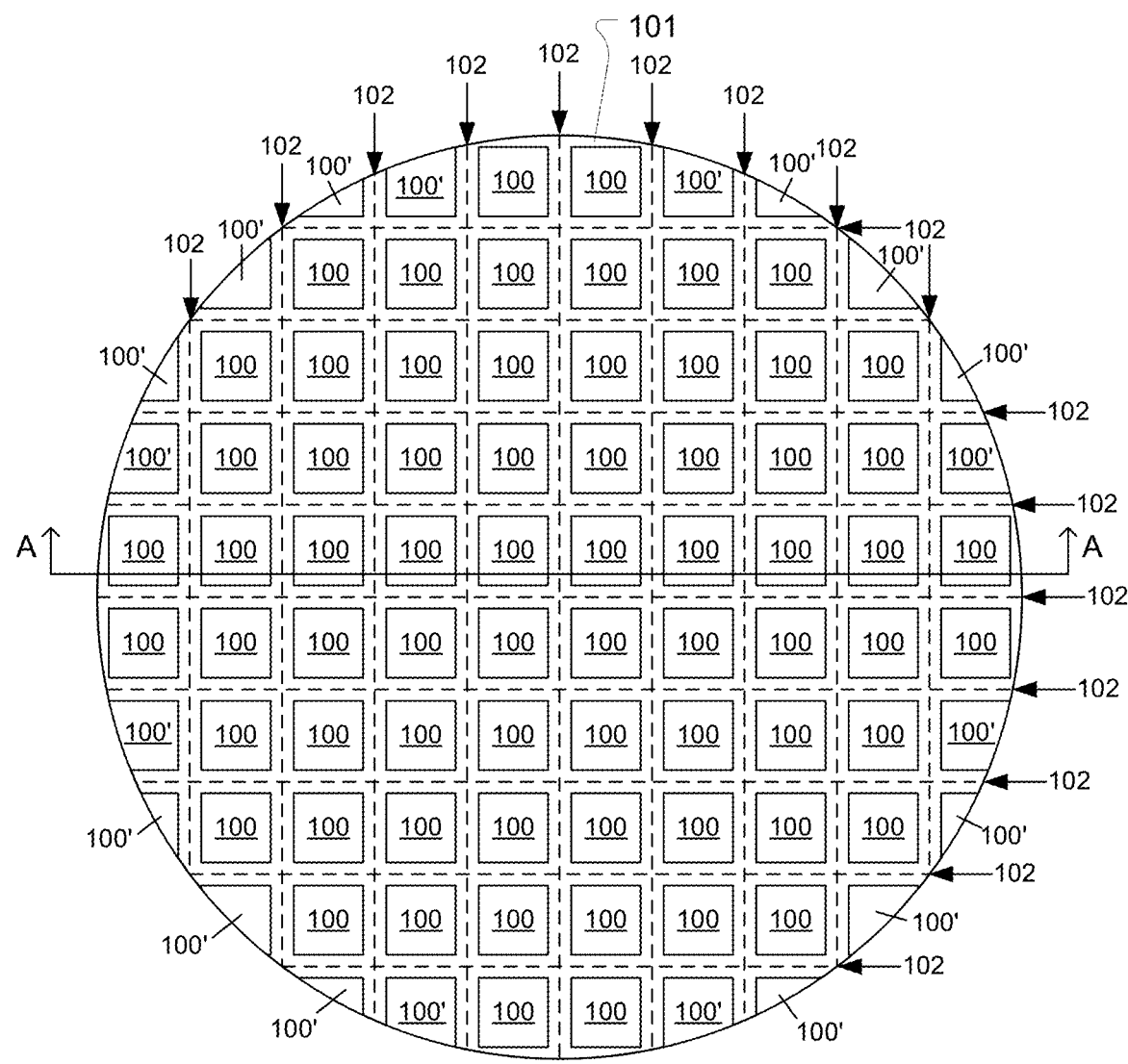
FIG. 1A shows a top view of an example wafer, in accordance with some embodiments.
Figure 1B:
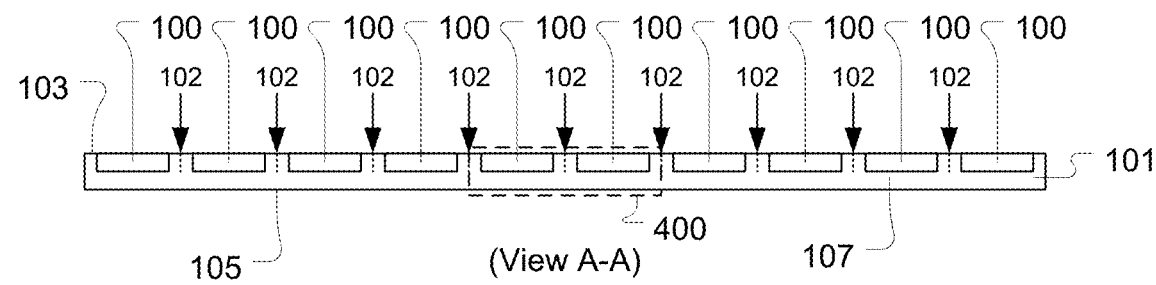
FIG. 1B shows a vertical cross-section of the wafer, corresponding to View A-A as referenced in FIG. 1A, in accordance with some embodiments.

FIG. 1A shows a top view of an example wafer 101, in accordance with some embodiments. The wafer 101 includes an array of die 100. Each die 100 is fabricated within the vertical thickness of the wafer 101 corresponding to a footprint of the die 100 on the wafer 101. The die 100 are separated from each other by kerf regions (dicing channels), which are present along the dashed lines 102. There are also a number of partially formed die 100' located at and around the radial periphery of the wafer 101. FIG. 1B shows a vertical cross-section of the wafer 101, corresponding to View A-A as referenced in FIG. 1A, in accordance with some embodiments. The wafer 101 has a top surface 103 and a bottom surface 105. The wafer 101 includes a substrate 107 (or handle in some embodiments) upon which the die 100/100' are fabricated. The portion of the substrate 107 below a given die 100/100' belongs to the given die 100/100'.

FIG. 1A represents the wafer 101 in an intact state in which the substrate 107 is unbroken/uncut across the wafer 101. For ease of description, the wafer 101 in the intact state is referred to as an intact wafer. After fabrication of the die 100 is complete, the wafer 100 is diced/singulated/cut/broken along the kerf regions corresponding to the dashed lines 102, to obtain the individual die 100 as physically separate structures. For ease of description, dicing/singulating/cutting/breaking of the wafer 101 along the kerf regions to release the individual die 100 from the intact wafer 101 is referred to as singulation of the die 100 from the wafer 101.

In some embodiments, photonic devices that enable wafer-level optical testing are fabricated within the wafer 101 and are accessible through the top surface 103 of the wafer 101. These photonic devices for optical testing may be inaccessible when the die 100 are singulated from the wafer 101 and flip-chip bonded to a package substrate. In addition to the photonic devices for optical testing, the die 100 also include photonic devices for normal optical input/output operation that are accessible through a bottom surface 105A of the die 100 corresponding to the bottom surface 105 of the wafer 101 prior to singulation of the die 100 from the wafer 101. These photonic devices for normal optical input/output operation of the die 100 are inaccessible when the bottom surface 105 of the wafer 101 is blocked by a support structure during wafer-level testing of the die 100 on the wafer 101. However, the photonic devices for normal optical input/output operation of the die 100 become accessible when the die 100 are singulated from the wafer 101 and flip-chip bonded to the package substrate.

Figure 2:
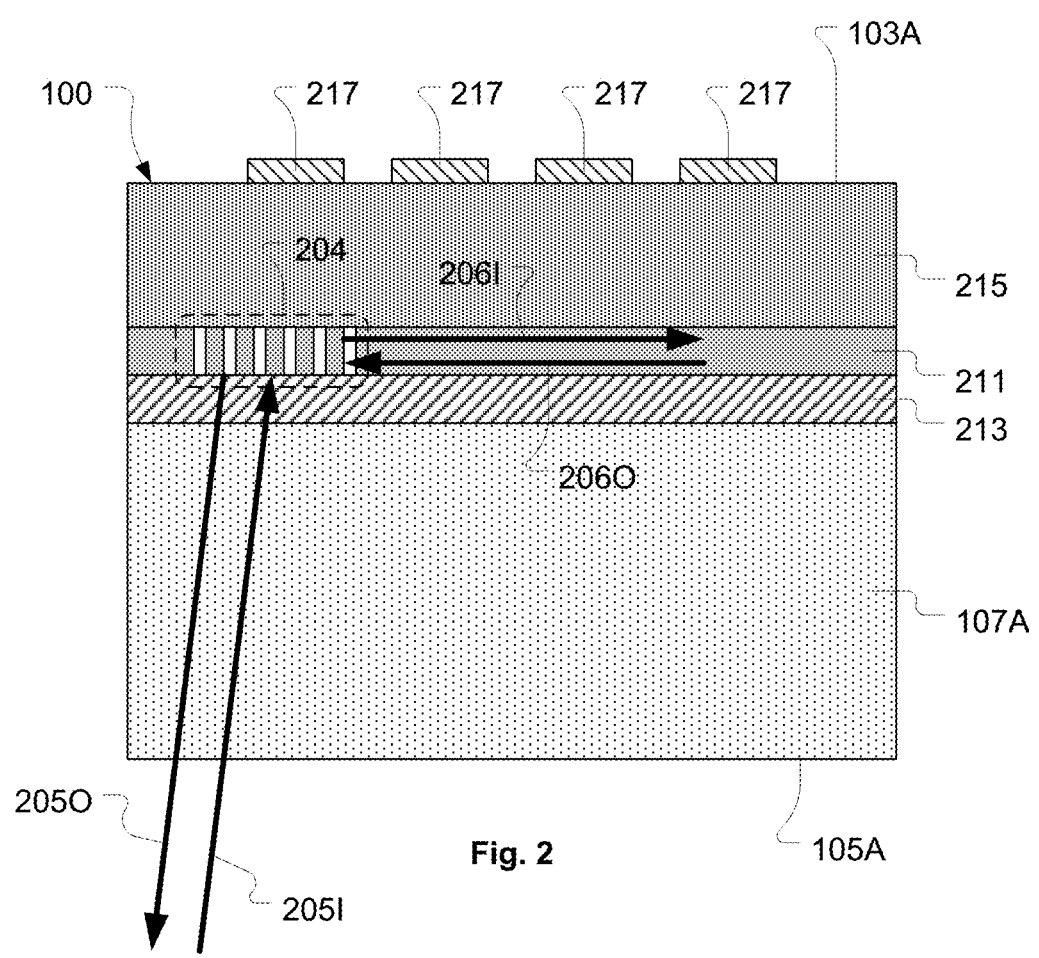
FIG. 2 shows a high-level schematic of a vertical cross-section the die after the die is singulated from the wafer, in accordance with some embodiments.

FIG. 2 shows a high-level schematic of a vertical cross-section the die 100 after the die 100 is singulated from the wafer 101, in accordance with some embodiments. The die 100 includes a substrate portion 107A corresponding to part of the substrate 107 of the wafer 101 upon which the die 100 is fabricated. The die 100 includes a layer 211 that includes monolithically integrated electronic devices and photonic devices. In various embodiments, the layer 211 includes interconnected optoelectronic devices, electronic devices, and optical devices configured to form interconnected photonic and electronic circuits. In some embodiments, the layer 211 is fabricated using industry standard CMOS manufacturing processes. The die 100 also includes a layer 213 and a layer 215 formed of lower refractive index material(s) relative to optical waveguide materials present in the layer 211, to provide for optical confinement of the optical waveguides in the layer 211. The layer 213 is referred to as a cladding layer of the die 100. In some embodiments, the layer 215 includes routings of conductive interconnect structures that are electrically isolated from each other, as needed, by intervening dielectric material(s). Some of these interconnect structures in the layer 215 are electrically connected to electrical contacts 217 exposed at a top surface 103A of the die 100, where the top surface 103A of the die 100 corresponds to the top surface 103 of the wafer 101. In some embodiments, the electrical contacts 217 are fabricated on the top surface 103A of the die 100, i.e., on the top surface 103 of the wafer 101. The layer 215 is referred to as a top layer of the die 100.

The layer 211 can include vertical optical grating couplers 204 for receiving light into optical waveguides within the layer 211 and for transmitting light from optical waveguides within the layer 211 in order to establish optical connections between the optical devices and/or optoelectronic devices within the layer 100, and other photonic devices outside of the die 100, such as other photonic devices used in optical data communication systems. For example, an arrow 205I represents transmission of light into the vertical optical grating coupler 204 from outside the die 100. And, arrow 205O represents transmission of light from the vertical optical grating coupler 204 to outside the die 100. As indicated by the arrow 205I, incoming light (which may be modulated or unmodulated and polarized or non-polarized) is transmitted from outside the die 100 through the substrate 107A and the layer 213 to reach the vertical optical grating coupler 204. And, as indicated by the arrow 205O, outgoing light (which may be modulated or unmodulated and polarized or non-polarized) is transmitted from the vertical optical grating coupler 204 through the layer 213 and the substrate 107A to a location outside the die 100. The vertical optical grating coupler 204 is configured to direct incoming light into one or more optical waveguides within the layer 211, as indicated by the arrow 206I. And, the vertical optical grating coupler 204 is configured to receive outgoing light from one or more optical waveguides within the layer 211, as indicated by the arrow 206O, and direct the outgoing light through the layer 213 and the substrate 107A to a location outside the die 100.

In some embodiments, the wafer 101 is a bulk CMOS silicon wafer, with die 100 manufactured in accordance with standard CMOS techniques. In some CMOS embodiments, the layer 213 can be a layer of optical cladding material. In some CMOS embodiments, the layer 213 can be omitted if the substrate 107A has a sufficient optical refractive index, e.g., has an optical refractive index that is sufficiently different than the optical refractive index of the optical waveguides within the layer 211. In some embodiments, the wafer 101 is a silicon-on-insulator (SOI) wafer, where the substrate 107 is bulk silicon (handle), the layer 213 is buried oxide (BOX), the layer 211 includes thin-film devices, and the layer 215 includes interlayer dielectric (ILD) and metal interconnect layers. It should be understood that this generalized description of bulk CMOS and SOI wafers is simplified for ease of description. The actual wafer 101 includes many additional sub-structures and sub-layers and other details that are not described herein in order to avoid obscuring description of the present invention.

Figure 3:
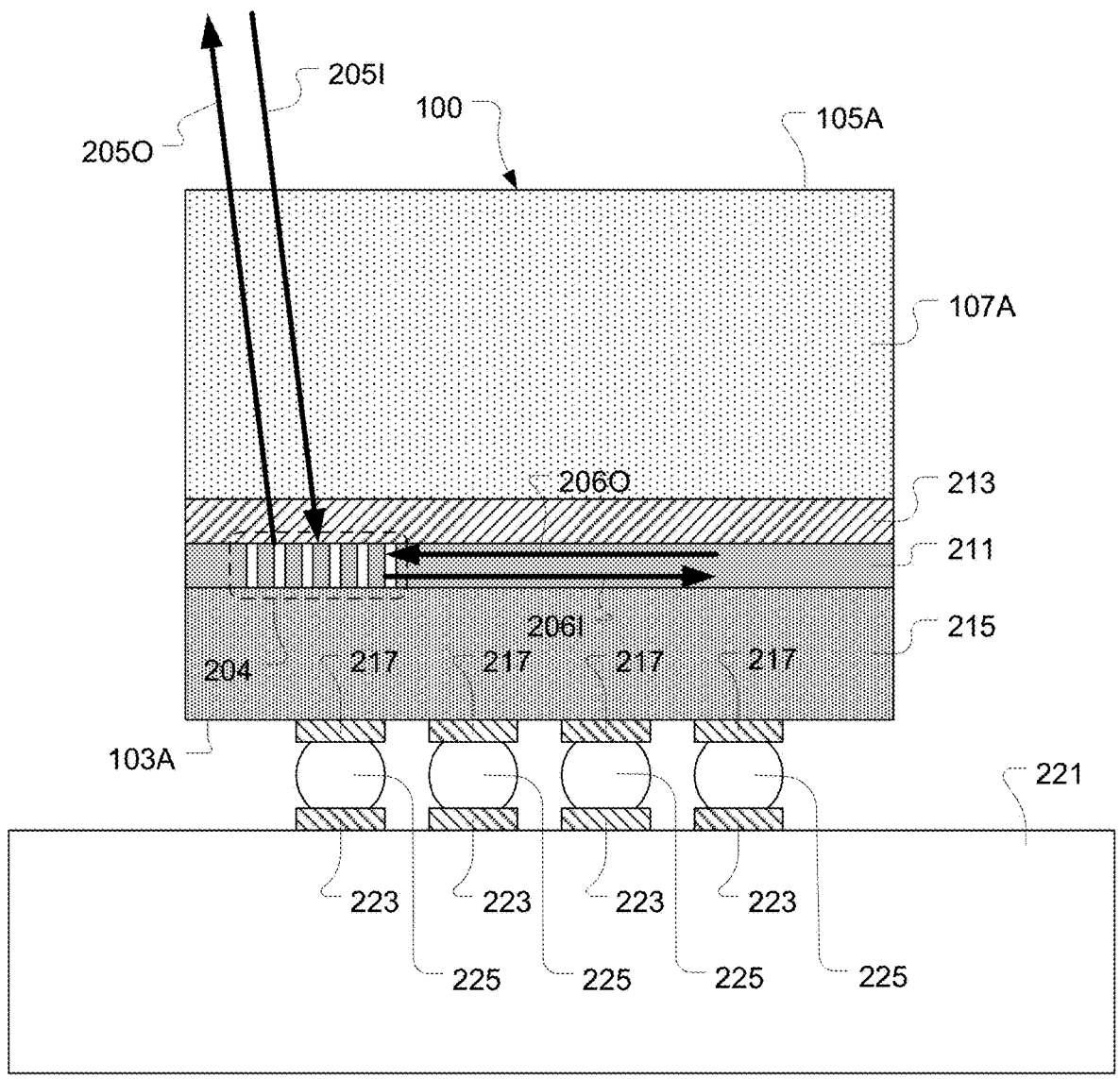
FIG. 3 shows the die connected to a package substrate in a flip-chip bonded configuration, in accordance with some embodiments.

In some embodiments, after the die 100 is singulated from the wafer 101, the die 100 is flip-chip bonded to a package substrate that includes electrical contacts and associated electrical routing and circuitry. FIG. 3 shows the die 100 connected to a package substrate 221 in a flip-chip bonded configuration, in accordance with some embodiments. In the flip-chip bonding of the die 100 to the package substrate 221, the die 100 is flipped upside-down so that the electrical contacts 217 for the electronic/optoelectronic devices formed in the die 100 are connected to corresponding electrical contacts 223 on the package substrate 221 using electrically conductive material 225, such as solder balls/bumps that are reflowed to establish the electrical connections. In various embodiments, the electrically conductive material 225 can be part of a ball grid array (BGA). Also in various embodiments, other components can be disposed between the die 100 and the package substrate 221, such as under-fill material. In the interest of clarity, such other components that may be present between the die 100 and the package substrate 221 are not shown in FIG. 3. Also, it should be understood that essentially any known technique for flip-chip bonding of the die 100 to the package substrate 221 (such as mass reflow, thermal-compression bonding (TCB), or other technique) can be used to achieve the configuration depicted in FIG. 3. Also, in many applications, it is desirable for the die 100, that includes integrated optoelectronic devices, to support flip-chip bonding of the die 100 onto any one of various standard package substrates.

When the die 100 is flip-chip bonded to the package substrate 221, the bottom surface 105A of the die 100 (the substrate 107A side of the die 100) faces away from the package substrate 221, which allows for transmission of light into and out of the die 100. Therefore, normal optical input/output to/from the optoelectronic devices within the die 100 is done by transmitting light through the bottom surface 105A of the die 100 that faces away from the package substrate 221. Therefore, the vertical optical grating couplers 204 that are used for optical input/output to/from the optoelectronic devices within the layer 211 of the die 100 are oriented toward the bottom surface 105A of the die 100 (toward the bottom surface 105 of the wafer 101).

Figure 4:
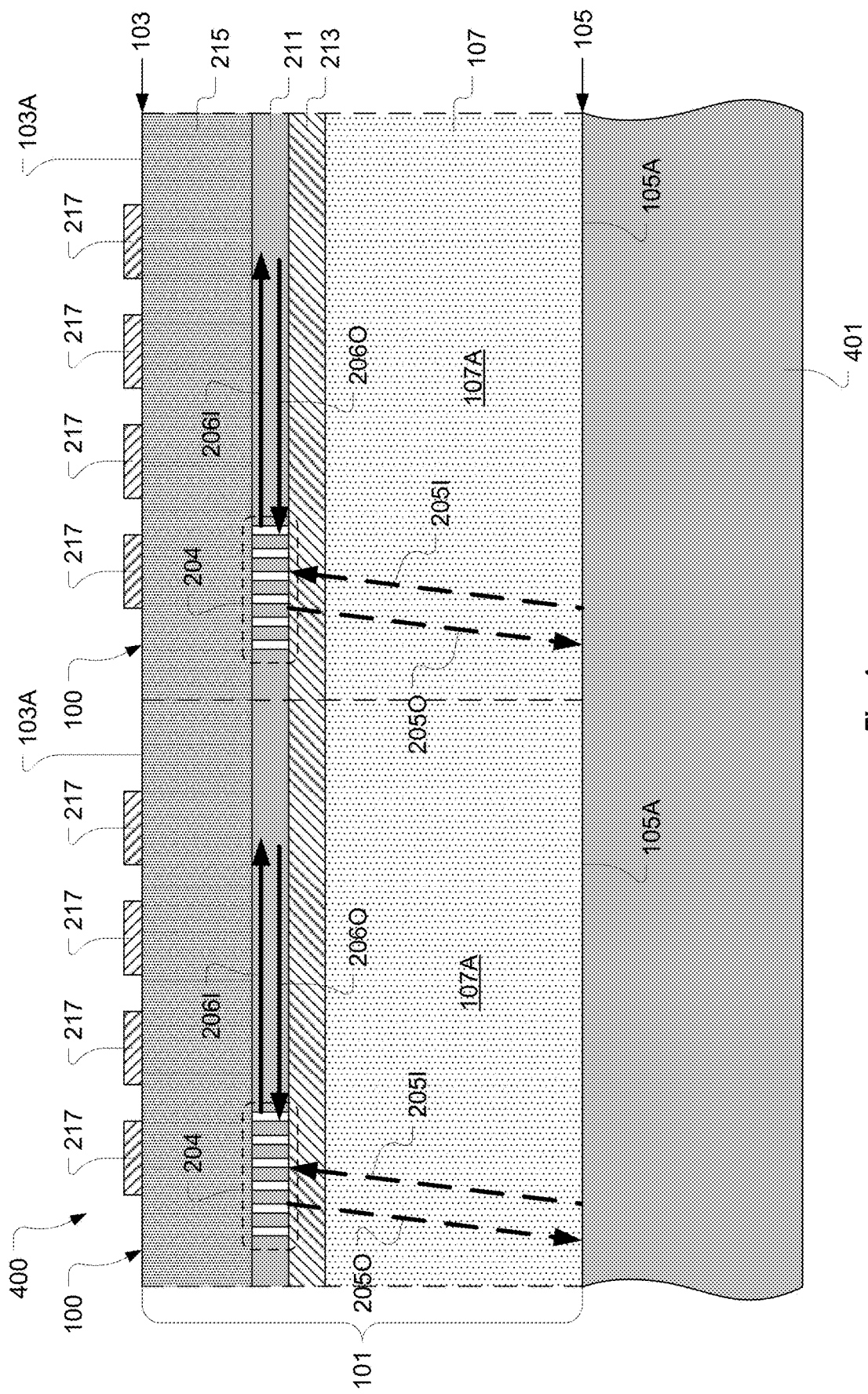
FIG. 4 shows a vertical cross-section through a portion of the wafer positioned on a chuck of a wafer prober, in accordance with some embodiments.

During testing of the die 100 on the completed wafer 101, the intact wafer 101 is positioned on a chuck of an industry standard wafer prober which lands probes on the electrical contacts 217 of the various die 100 fabricated within the wafer 101 to enable testing of the electrical circuits formed within the die 100. FIG. 4 shows a vertical cross-section through a portion 400 of the wafer 101 positioned on a chuck 401 of a wafer prober, in accordance with some embodiments. The portion 400 of the wafer 100 is referenced in FIG. 1B. When the bottom surface 105 of the wafer 101 is positioned on the chuck 401 of the wafer prober, the vertical optical grating couplers 204 that are used for optical input/output to/from the optoelectronic devices within the layer 211 of the die 100 are blocked by the chuck 401 and are inaccessible for use in optical testing of the optoelectronic devices within the die 100. This blocked situation is illustrated by the arrow 205I for incoming light having a dashed representation, and by the arrow 205O for outgoing light having a dashed representation. In this situation, the ability to perform wafer-level photonic testing on the photonic circuits in the die 100 in conjunction with electrical testing of the die 100 is lost. In other words, positioning of the bottom surface 105 of the wafer 101 on the chuck 401 of the wafer prober prevents the photonic circuits in the die 100 from being screened/tested during wafer-level testing. It should be appreciated that the loss of the ability to perform wafer-level photonic testing on the die 100 takes away one of the advantages of having vertical optical grating couplers 204 formed within the die 100. In view of the foregoing, it is of interest to be able to perform both photonic testing and electrical testing on the die 100, with the die 100 in the intact (non-singulated) wafer 101.

Figure 5:
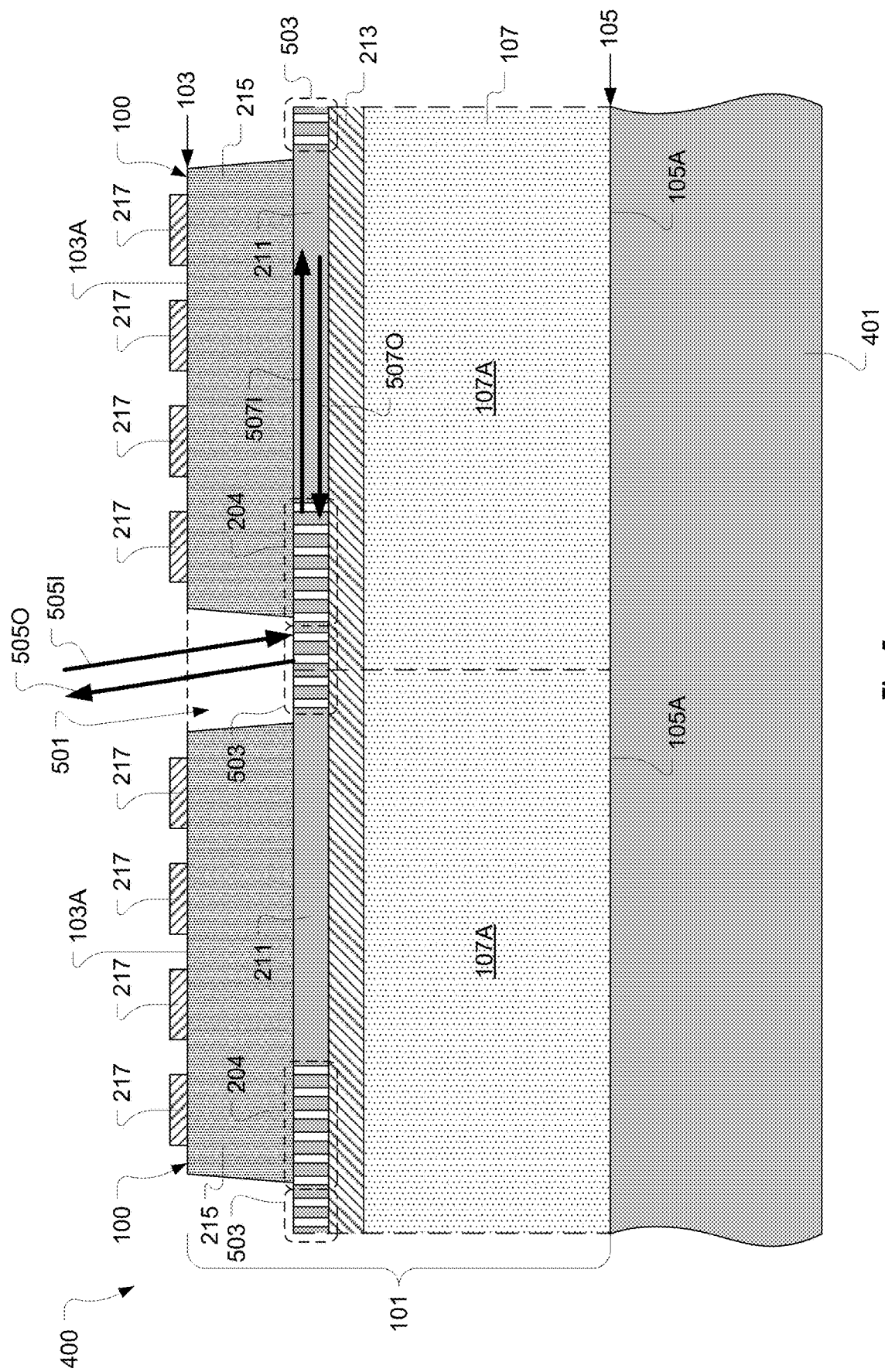
FIG. 5 shows a vertical cross-section through the portion of the wafer positioned on the chuck of the wafer prober, with a photonic test port accessible through the top surface of the wafer, in accordance with some embodiments.

FIG. 5 shows a vertical cross-section through the portion 400 of the wafer 101 positioned on the chuck 401 of the wafer prober, with a photonic test port 503 accessible through the top surface 103 of the wafer 101, in accordance with some embodiments. In some embodiments, the layer 215 may include metal and/or other materials that prevent or impair transmission of light through the layer 215 at the location of the photonic test port 503. Therefore, in some embodiments, a light transfer region 501 is defined in the layer 215 above the photonic test port 503. In some embodiments, the light transfer region 501 is a region of the layer 215 controlled to not include metal, with the material of the layer 215 in the light transfer region 501 providing for transmission of light into and out of the photonic test port 503. In some embodiments, the light transfer region 501 is an area on the top surface 103 of the wafer 101 in which the layer 215 has been removed to expose the photonic test port 503. Therefore, it should be understood that the light transfer region 501 provides a window for optical coupling with the photonic test port 503.

In some embodiments, the photonic test port 503 is configured as a vertical optical grating coupler for receiving light into optical waveguides within the layer 211 and for transmitting light from optical waveguides within the layer 211 in order to establish optical connections between the optical devices and/or optoelectronic devices within the layer 211 and other photonic devices outside of the die 100, such as other photonic devices used in photonic testing of the die 100. For example, an arrow 505I represents transmission of light into the vertical optical grating coupler of the photonic test port 503 from outside the die 100. And, arrow 505O represents transmission of light from the vertical optical grating coupler of the photonic test port 503 to outside the die 100. As indicated by the arrow 505I, incoming light (which may be modulated or unmodulated and polarized or non-polarized) is transmitted from outside the die 100 through the light transfer region 501 to reach the vertical optical grating coupler of the photonic test port 503. And, as indicated by the arrow 505O, outgoing light (which may be modulated or unmodulated and polarized or non-polarized) is transmitted from the vertical optical grating coupler of the photonic test port 503 through the light transfer region 501 to a location outside the die 100. The vertical optical grating coupler of the photonic test port 503 is configured to receive incoming light through the light transfer region 501, as indicated by arrow 505I, and direct the incoming light into one or more optical waveguides within the layer 211, as indicated by the arrow 507I. And, the vertical optical grating coupler of the photonic test port 503 is configured to receive outgoing light from one or more optical waveguides within the layer 211, as indicated by the arrow 507O, and direct the outgoing light through the light transfer region 501 to a location outside the die 100, as indicated by arrow 505O. Therefore, it should be understood that the light transfer region 501 and the photonic test port 503 enables wafer-level photonic testing of the die 100 in conjunction with wafer-level electrical testing of the die 100, with the bottom surface 105 of the wafer 101 positioned on the chuck 401 of the wafer prober. Also, in some embodiments, in addition to being used for wafer-level photonic testing, the light transfer region 501 and the photonic test port 503 can be used as an optical input/output mechanism for the die 100 after the die 100 is bonded to the package substrate 221, such as shown in FIG. 3. Also, in some embodiments, the light transfer region 501 and the photonic test port 503 can be formed within the kerf regions (dicing channels), which are present along the dashed lines 102 between the die 100, as shown in FIG. 1A. In these embodiments, the light transfer region 501 and the photonic test port 503 can be formed and used without consuming or adding to die 100 area on the wafer 101.

Figure 6:
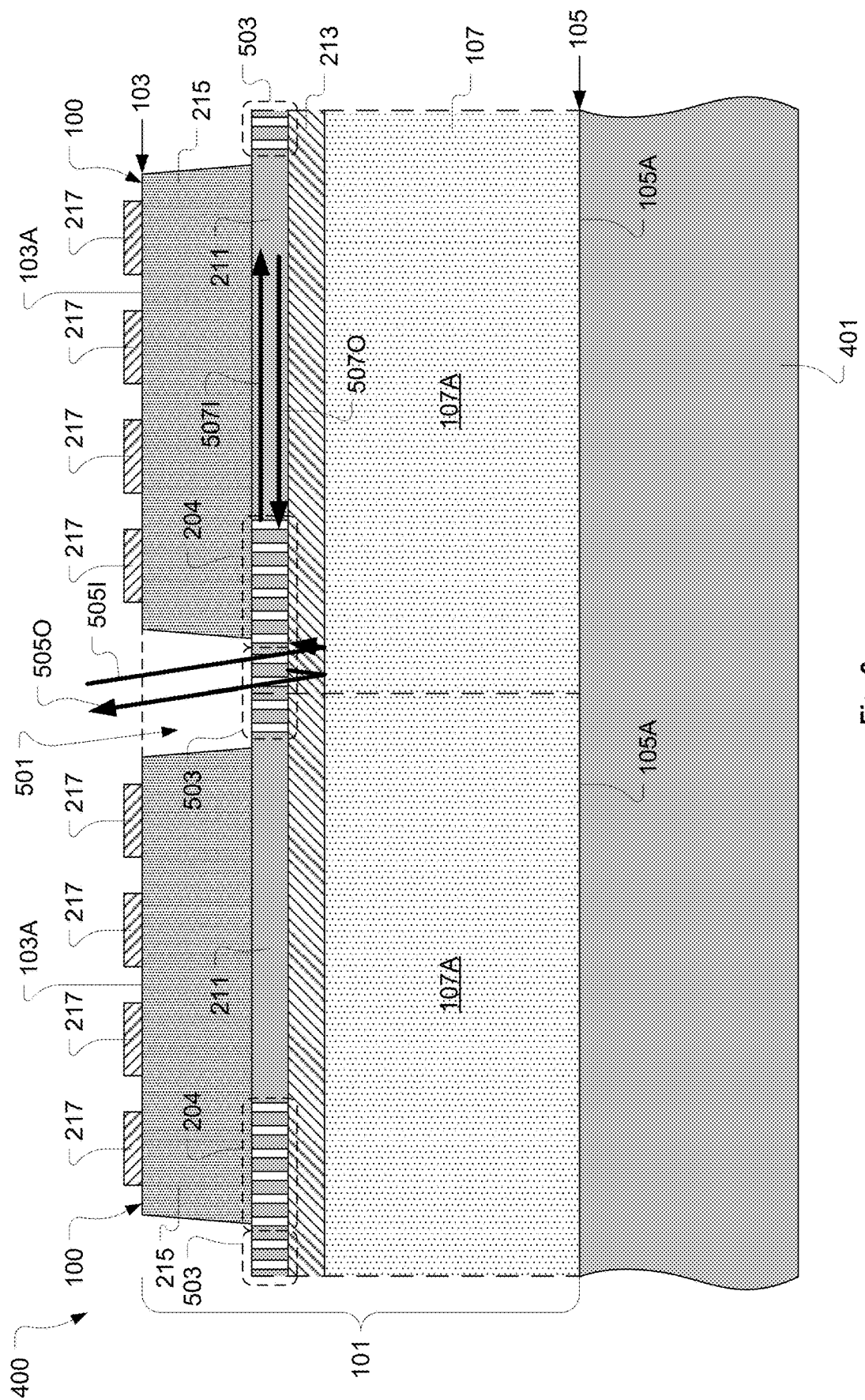
FIG. 6 shows a vertical cross-section through the portion of the wafer positioned on the chuck of the wafer prober, with the photonic test port accessible through the top surface of the wafer, and with the die having a reflective interface at the top surface of the substrate, in accordance with some embodiments.

FIG. 6 shows a vertical cross-section through the portion 400 of the wafer 101 positioned on the chuck 401 of the wafer prober, with the photonic test port 503 accessible through the top surface 103 of the wafer 101, and with the die 100 having a reflective interface between the substrate 107A and the layer 213, in accordance with some embodiments. The description of FIG. 5 applies equally to FIG. 6, with the exception of the reflective interface between the substrate 107A and the layer 213. The incoming light during wafer-level photonic testing of the die 100, as indicated by arrow 505I, passes through the light transfer region 501 and through the layer 211 and through the layer 213, then reflects off of the reflective interface between the substrate 107A and the layer 213 to enter back into the photonic test port 503 in a direction that incoming light during normal operation of the die 100 would enter the vertical optical grating coupler 204, where normal operation of the die 100 occurs after flip-chip packaging of the die 100 onto the package substrate 221, as described with regard to FIG. 3.

In some embodiments, the incoming light during photonic testing, as indicated by arrow 505I, passes through the layer 211 by passing through the photonic test port 503. In some embodiments, the incoming light during photonic testing, as indicated by arrow 505I, passes through the layer 211 by passing around or next to the photonic test port 503. In some embodiments, the top surface of the substrate 107A is defined as a reflective surface for the incoming light. Once the incoming light during photonic testing, as indicated by arrow 505I, is reflected back into the photonic test port 503 by the interface between the substrate 107A and the layer 213, the incoming light is transmitted from the photonic test port 503 into one or more optical waveguides within the layer 211, as indicated by arrow 507I, for testing of photonic circuits within the die 100.

The outgoing light during photonic testing, as indicated by arrow 505O, is received into the photonic test port 503 from one or more optical waveguides within the layer 211, as indicated by arrow 507O. In the example embodiment of FIG. 6, the photonic test port 503 is configured to direct the outgoing light through the layer 213 toward the substrate 107A in a direction that the outgoing light would travel during normal operation of the die 100, where normal operation of the die 100 occurs after flip-chip packaging of the die 100 onto the package substrate 221, as described with regard to FIG. 3. In the example embodiment of FIG. 6, the outgoing light (or portion thereof) during wafer-level photonic testing of the die 100, is reflected off of the reflective interface between the substrate 107A and the layer 213 to pass back through the layer 213 and the photonic test port 503 and the light transfer region 501, as indicated by arrow 505O.

Figure 7:
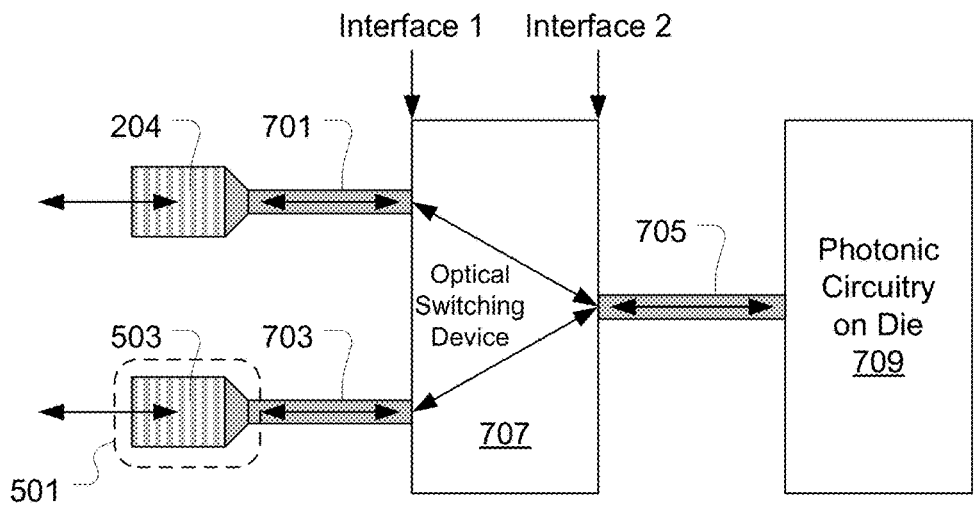
FIG. 7 shows a schematic diagram of a portion of the device layer within the die in which the photonic test port is switchable with a normal vertical optical grating coupler, in accordance with some embodiments.

FIG. 7 shows a schematic diagram of a portion of the layer 211 within the die 100 in which the photonic test port 503 is switchable with a normal vertical optical grating coupler 204, in accordance with some embodiments. The vertical optical grating coupler 204 is optically connected to an optical waveguide 701. The optical waveguide 701 is optically connected to a first optical input/output port on a first interface of an optical switching device 707. Similarly, the photonic test port 503 is optically connected to an optical waveguide 703. The optical waveguide 703 is optically connected to a second optical input/output port on the first interface of the optical switching device 707. An optical input/output port on a second interface of the optical switching device 707 is optically connected to an optical waveguide 705. The optical waveguide 705 is optically connected to an optical input/output port of photonic circuitry 709 defined within the layer 211 of the die 100.

In some embodiments, the vertical optical grating coupler 204 is configured to optically couple downward toward the bottom surface 105A of the die 100 in a bidirectional manner. In this manner, the vertical optical grating coupler 204 receives incoming light through the substrate 107A and the layer 213, and directs outgoing light through the substrate 107A and the layer 213. In some embodiments, the vertical optical grating coupler 204 is used during normal operation of the die 100, after the die 100 is flip-chip bonded to the package substrate 221, as shown in FIG. 3. Therefore, the vertical optical grating coupler 204 is referred to as a normal vertical optical grating coupler. In some embodiments, the photonic test port 503 is a vertical optical grating coupler configured to optically couple upward toward the top surface 103A of the die 100 in a bidirectional manner. In this manner, the photonic test port 503 receives incoming light through the light transfer region 501, and directs outgoing light through the light transfer region 501. In some embodiments, the photonic test port 503 is used during wafer-level testing of the photonic circuitry 709 on the die 100, such as when the intact wafer 101 is positioned on the chuck 401 of the wafer prober, as shown in FIGS. 5 and 6. In this manner, the photonic test port 503 can be used to measure the electro-optic response of the photonic circuitry 709 on the die 100 across variations in optical power, wavelength, polarization, modulation, and/or other optical parameter(s), in conjunction with use of the wafer prober to perform electrical testing on the die 100 through the electrical contacts 217.

When the die 100 is flip-chip packaged, the optical switching device 707 is configured/controlled to optically connect the vertical optical grating coupler 204 to the photonic circuitry 709 on the die 100 by way of the optical waveguides 701 and 705. However, when the die 100 is undergoing wafer-level testing as part of the intact wafer 101, the optical switching device 707 is configured/controlled to optically connect the photonic test port 503 to the photonic circuitry 709 on the die 100 by way of the optical waveguides 703 and 705. In the example embodiment of FIG. 7, each of the optical switching device 707, the vertical optical grating coupler 204, the photonic test port 503, and the optical waveguides 701, 703, and 705 is bi-directional with regard to light transmission. In this manner, the optical switching device 707 uses each of the optical waveguides 701, 703, and 705 for both optical input and an optical output.

In some embodiments, the optical switching device 707 is an active device that includes electro-optical components. In some embodiments, the electro-optical components of the optical switching device 707 are compatible with microfabrication. In these embodiments, operation of the optical switching device 707 can be controlled once electrical connections are made to the die 100 through the electrical contacts 217 during wafer-level testing of the die 100. In some embodiments, the wafer prober is operated to control the optical switching device 707 to optically connect the photonic test port 503 to the photonic circuitry 709 on the die 100 by way of the optical waveguides 703 and 705. In some embodiments, the wafer prober is operated to directly control electro-optical components within the optical switching device 707 to establish optical connectivity between the photonic test port 503 and the photonic circuitry 709 on the die 100 by way of the optical waveguides 703 and 705. In some embodiments, the wafer prober is operated to signal electronic control circuits on the die 100 to control electro-optical components within the optical switching device 707 to establish optical connectivity between the photonic test port 503 and the photonic circuitry 709 on the die 100 by way of the optical waveguides 703 and 705. In some embodiments, electro-optical components within the optical switching device 707 are configured to default to a normal operation configuration in which the vertical optical grating coupler 204 is optically connected to the photonic circuitry 709 on the die 100 by way of the optical waveguides 701 and 705. For example, in some embodiments, electro-optical components within the optical switching device 707 can be configured to default to a normal operation configuration when not explicitly controlled to establish optical connectivity between the photonic test port 503 and the photonic circuitry 709 on the die 100 by way of the optical waveguides 703 and 705. In some embodiments, the optical switching device 707 is configured to be in the normal operation configuration when the optical switching device 707 is unbiased, e.g., not electrically activated.

In some embodiments, the optical switching device 707 is a passive device that includes optical components and that does not require electrical input/control. For example, the optical switching device 707 configured a passive device may not include electro-optical components, and/or electrical components. In some embodiments, the optical switching device 707 is configured as a passive device that includes a passive optical coupler that is modified by a processing/fabrication operation after wafer-level testing (after wafer sort). More specifically, the optical switching device 707 is configured so that the passive optical coupler in the optical switching device 707 optically connects the photonic test port 503 to the photonic circuitry 709 on the die 100 during wafer-level testing of the die 100. Then, after wafer-level testing of the die 100, the die 100 is singulated from the wafer 101 and flip-chip packaged to the substrate 221, such that the vertical optical grating coupler 204 is accessible through the substrate 107A of the die 100. With the die 100 in this packaged configuration, the passive optical coupler in the optical switching device 707 can provide a low-loss optical coupling between the vertical optical grating coupler 204 and the photonic circuitry 709 on the die 100, by way of the optical waveguides 701 and 705. In some embodiments, after completion of the wafer-level photonic testing, a processing/fabrication operation is performed on the passive optical coupler in the optical switching device 707 to establish the low-loss optical coupling between the vertical optical grating coupler 204 and the photonic circuitry 709 on the die 100, by way of the optical waveguides 701 and 705. For example, the passive optical coupler in the optical switching element 707 can have optically phase-matched optical waveguides when wafer-level photonic testing is performed on the die 100. Then, after completion of wafer-level photonic testing of the die 100, a processing/fabrication operation can be performed to shift the optical phase velocity in an optical waveguide of the passive optical coupler in the optical switching element 707 so that the low-loss optical coupling is established between the vertical optical grating coupler 204 and the photonic circuitry 709 on the die 100. In some embodiments, the processing/fabrication operation to modify the optical switching element 707 after completion of wafer-level photonic testing of the die 100 can be incorporated in a handle-release process. Also, in some embodiments, after completion of the wafer-level photonic testing using the photonic test port 503, a processing/fabrication operation can be done to optically block the photonic test port 503, such as by depositing a light blocking material within the light transfer region 501. However, in some embodiments, after completion of the wafer-level photonic testing using the photonic test port 503, the photonic test port 503 is left unobscured with regard to light transmission into and out of the photonic test port 503.

In accordance with the foregoing, in some embodiments, the wafer 101 is disclosed to include the plurality of die 100 formed on the wafer 101, with the wafer 101 in an intact configuration. The wafer 101 has the top surface 103 and the bottom surface 105. Each of the plurality of die 100 has the top layer 215 that includes routings of conductive interconnect structures electrically isolated from each other by intervening dielectric material. The top surface 103A of the top layer 215 corresponds to the top surface 103 of the wafer 101. Each of the plurality of die 100 has the device layer 211 located below the top layer 215. The device layer 211 includes optical devices and electronic devices. Each of the plurality of die 100 has the cladding layer 213 formed below the device layer 211. The cladding layer 213 has a refractive index different than a refractive index of optical waveguides formed within the device layer 211. The cladding layer 213 is formed on the substrate 107 of the wafer 101. Each of the plurality of die 100 includes a respective portion of the substrate 107A. The bottom surface 105A of the substrate portion 107A of each die 100 corresponds to the bottom surface 105 of the wafer 101. Each of the plurality of die 100 includes the photonic test port 503 within the device layer 211. The wafer 101 also includes the light transfer region 501 formed within the wafer 101, with the wafer 101 in the intact configuration. The light transfer region 501 extends through the top layer 215 to the photonic test port 503 within the device layer 211. The light transfer region 501 provides a window for transmission of light into and out of the photonic test port 503 from and to a location on the top surface 103 of the wafer 101.

In some embodiments, the photonic test port 503 is a vertical optical grating coupler. In some embodiments, the light transfer region 501 is a region of the top layer 215 controlled to not include metal. In these embodiments, the material of the top layer 215 within the light transfer region 501 allows for transmission of light. In some embodiments, the light transfer region 501 is formed of a material that allows transmission of light into and out of the photonic test port 503. In other embodiments, the light transfer region 501 is an open region formed in the top layer 215 to expose the photonic test port 503. The light transfer region 501 and the photonic test port 503 are collectively configured to enable wafer-level photonic testing of a corresponding one of the plurality of die 100, in conjunction with wafer-level electrical testing of the corresponding one of the plurality of die 100, when the bottom surface 105 of the wafer 101 is positioned on a chuck of a wafer prober.

In some embodiments, the light transfer region 501 and the photonic test port 503 are formed in a kerf region between neighboring die 100 on the wafer 101. In some embodiments, the top surface of the substrate 107 is a reflective interface for light traveling in a direction toward the substrate 107 from the top surface 103 of the wafer 101. In these embodiments, the reflective interface at the top surface of the substrate 107 is configured to redirect light traveling from the light transfer region 501 to the top surface of the substrate 107 back into the photonic test port 503. Also, in these embodiments, the reflective interface at the top surface of the substrate 107 is configured to redirect light traveling from the photonic test port 503 to the top surface of the substrate 107 back into the light transfer region 501.

In some embodiments, the photonic test port 503 is switchable with the normal vertical optical grating coupler 204 within the device layer 211. The photonic test port 503 enables wafer-level photonic testing of photonic devices coupled to the normal vertical optical grating coupler 204. In some embodiments, the normal vertical optical grating coupler 204 is configured to receive incoming light transmitted through the bottom surface 105A of the substrate 107A. Also, the normal vertical optical grating coupler 204 is configured to transmit outgoing light through the bottom surface 105A of the substrate 107A. In some embodiments, the photonic test port 503 is configured to receive incoming light transmitted through the light transfer region 501 from the location on the top surface 103 of the wafer 101. Also, the photonic test port 503 is configured to transmit outgoing light through the light transfer region 501 toward the location on the top surface 103 of the wafer 101.

In some embodiments, each of the plurality of die 100 includes the optical switching device 707 that has a first optical port optically connected to an optical circuit within the device layer 211. The optical switching device 707 also has a second optical port optically connected to the normal vertical optical grating coupler 204 within the device layer 211. The optical switching device 707 also has a third optical port optically connected to the photonic test port 503 within the device layer 211. The optical switching device 707 is configured to optically connect the third optical port to the first optical port for wafer-level photonic testing. The optical switching device 707 is configured to optically connect the second optical port to the first optical port for normal die 100 operation.

In some embodiments, the optical switching device 707 is an active device controllable through electronic signals. In some embodiments, the optical switching device 707 is configured to default to optical connection of the second optical port to the first optical port for normal die 100 operation. In some embodiments, the optical switching device 707 is a passive device initially configured to optically connect of the third optical port to the first optical port for wafer-level photonic testing. In these embodiments, the optical switching device 707 is reconfigurable to optically connect of the second optical port to the first optical port for normal die 100 operation after wafer-level photonic testing. In some embodiments, the optical switching device 707 is reconfigured to have a low-loss optical coupling between the second optical port and the first optical port for normal die 100 operation after wafer-level photonic testing. In some embodiments, the low-loss optical coupling is implemented by a shift in optical phase velocity within one or more optical waveguides within the optical switching device 707.

Figure 8:
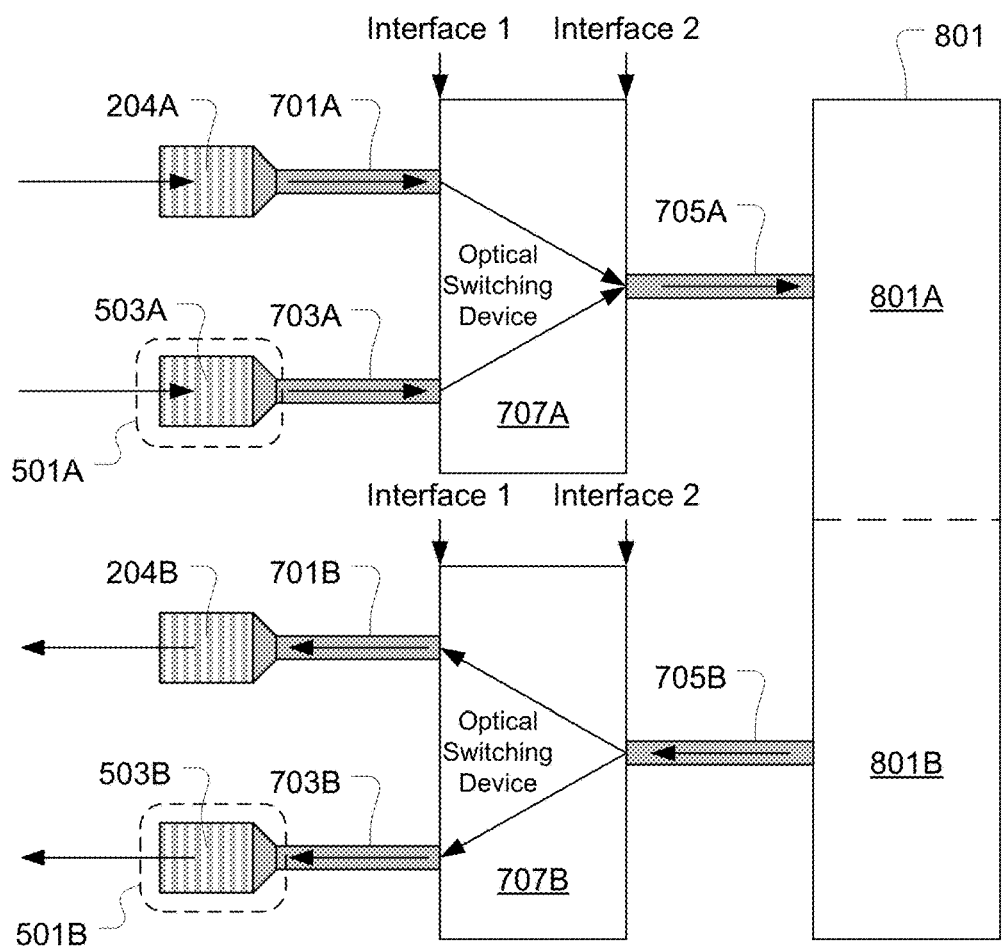
FIG. 8 shows a schematic diagram of a portion of the device layer within the die in which photonic circuitry is configured to have an optical input and an optical output that are separate from each other, in accordance with some embodiments.

FIG. 8 shows a schematic diagram of a portion of the layer 211 within the die 100 in which photonic circuitry 801 is configured to have an optical input and an optical output that are separate from each other, in accordance with some embodiments. The optical input of the photonic circuitry 801 is optically connected to an optical waveguide 705A. The optical output of the photonic circuitry 801 is optically connected to an optical waveguide 705B. In various embodiments, the photonic circuitry 801 can be an optical modulator or a wavelength division multiplexing (WDM) add/drop photonic circuit, or essentially any other photonic circuit in which the optical input is separate from the optical output.

A vertical optical grating coupler 204A is optically connected to an optical waveguide 701A. The description of the vertical optical grating coupler 204 herein is equally applicable to the vertical optical grating coupler 204A. The optical waveguide 701A is optically connected to a first optical input on a first interface of an optical switching device 707A. Similarly, the photonic test port 503A is optically connected to an optical waveguide 703A. The optical waveguide 703A is optically connected to a second optical input on the first interface of the optical switching device 707A. An optical output on a second interface of the optical switching device 707A is optically connected to the optical waveguide 705A. The optical waveguide 705A is optically connected to an optical input port of photonic circuitry 801 on the die 100, such as photonic circuitry 801 defined within the layer 211 of the die 100. When the die 100 is flip-chip packaged, the optical switching device 707A is configured/controlled to optically connect the vertical optical grating coupler 204A to the photonic circuitry 801 on the die 100 by way of the optical waveguides 701A and 705A. However, when the die 100 is undergoing wafer-level testing as part of the intact wafer 101, the optical switching device 707A is configured/controlled to optically connect the photonic test port 503A to the photonic circuitry 801 on the die 100 by way of the optical waveguides 703A and 705A.

A vertical optical grating coupler 204B is optically connected to an optical waveguide 701B. The description of the vertical optical grating coupler 204 herein is equally applicable to the vertical optical grating coupler 204B. The optical waveguide 701B is optically connected to a first optical output on a first interface of an optical switching device 707B. Similarly, the photonic test port 503B is optically connected to an optical waveguide 703B. The optical waveguide 703B is optically connected to a second optical output on the first interface of the optical switching device 707B. An optical input on a second interface of the optical switching device 707B is optically connected to the optical waveguide 705B. The optical waveguide 705B is optically connected to an optical output port of the photonic circuitry 801 on the die 100, such as photonic circuitry 801 defined within the layer 211 of the die 100. When the die 100 is flip-chip packaged, the optical switching device 707B is configured/controlled to optically connect the vertical optical grating coupler 204B to the photonic circuitry 801 on the die 100 by way of the optical waveguides 701B and 705B. However, when the die 100 is undergoing wafer-level testing as part of the intact wafer 101, the optical switching device 707B is configured/controlled to optically connect the photonic test port 503B to the photonic circuitry 801 on the die 100 by way of the optical waveguides 703B and 705B.

In the example embodiment of FIG. 8, the optical switching device 707A, the vertical optical grating coupler 204A, the photonic test port 503A, and the optical waveguides 701A, 703A, and 705A are configured to receive and direct incoming light into the photonic circuitry 801 on the die 100. Also, in the example embodiment of FIG. 8, the optical switching device 707B, the vertical optical grating coupler 204B, the photonic test port 503B, and the optical waveguides 701B, 703B, and 705B are configured to receive and direct outgoing light from the photonic circuitry 801 on the die 100.

In some embodiments, each of the vertical optical grating couplers 204A and 204B is configured to optically couple downward toward the bottom surface 105A of the die 100. In this manner, the vertical optical grating coupler 204A receives incoming light through the substrate 107A and the layer 213. And, the vertical optical grating coupler 204B directs outgoing light through the substrate 107A and the layer 213. In some embodiments, the vertical optical grating couplers 204A and 204B are used during normal operation of the die 100 after the die 100 is flip-chip bonded to the package substrate 221, as shown in FIG. 3. In some embodiments, each of the photonic test ports 503A and 503B is a vertical optical grating coupler configured to optically couple upward toward the top surface 103A of the die 100. In this manner, the photonic test port 503A receives incoming light through the light transfer region 501. And, the photonic test port 503B directs outgoing light through the light transfer region 501. In some embodiments, the photonic test ports 503A and 503B are used during wafer-level testing of the photonic circuitry 801 on the die 100, such as when the intact wafer 101 is positioned on the chuck 401 of the wafer prober, as shown in FIGS. 5 and 6. In this manner, the photonic test ports 503A and 503B can be used to measure the electro-optic response of the photonic circuitry 801 on the die 100 across variations in optical power, wavelength, polarization, modulation, and/or other optical parameter(s), in conjunction with use of the wafer prober to perform electrical testing on the die 100 through the electrical contacts 217.

When the die 100 is flip-chip packaged, the optical switching device 707A is configured/controlled to optically connect the vertical optical grating coupler 204A to the photonic circuitry 801 on the die 100 by way of the optical waveguides 701A and 705A, and the optical switching device 707B is configured/controlled to optically connect the vertical optical grating coupler 204B to the photonic circuitry 801 on the die 100 by way of the optical waveguides 701B and 705B. However, when the die 100 is undergoing wafer-level testing as part of the intact wafer 101, the optical switching device 707A is configured/controlled to optically connect the photonic test port 503A to the photonic circuitry 801 on the die 100 by way of the optical waveguides 703A and 705A, and the optical switching device 707B is configured/controlled to optically connect the photonic test port 503B to the photonic circuitry 801 on the die 100 by way of the optical waveguides 703B and 705B.

In some embodiments, the optical switching device 707A is a passive device that includes optical components and that do not require electrical input/control, in the same manner as described herein with regard to the passive device embodiments of the optical switching device 707. In some embodiments, the optical switching device 707A is an active device that includes electro-optical components that are electrically controlled, in the same manner as described herein with regard to the active device embodiments of the optical switching device 707. In some embodiments, the optical switching device 707B is a passive device that includes optical components and that do not require electrical input/control, in the same manner as described herein with regard to the passive device embodiments of the optical switching device 707. In some embodiments, the optical switching device 707B is an active device that includes electro-optical components that are electrically controlled, in the same manner as described herein with regard to the active device embodiments of the optical switching device 707.

In some embodiments, the electronics on the die 100 include a state machine formed by very large scale integration (VLSI) circuits. Test procedures for VLSI circuits are known as design for test (DFT). Test coverage of DFT often depends on the speed at which test vectors can be sent into and pulled out of the state machine circuitry. In some embodiments, the photonic circuitry 801 can include optical receiver circuitry 801A with very high data rate and optical transmitter circuitry 801B with similarly high data rate. In such embodiments, test coverage of DFT may be greatly enhanced by using the optical receiver circuitry 801A and the optical transmitter circuitry 801B to move test vectors and results into and out of the state machine circuitry.

In accordance with the example embodiment of FIG. 8, in some embodiments, the wafer 101 is disclosed to include the plurality of die 100 formed on the wafer 101, with the wafer 101 in an intact configuration. The wafer 101 has the top surface 103 and the bottom surface 105. Each of the plurality of die 100 has the top layer 215 that includes routings of conductive interconnect structures electrically isolated from each other by intervening dielectric material. The top surface 103A of the top layer 215 corresponds to the top surface 103 of the wafer 101. Each of the plurality of die 100 has the device layer 211 located below the top layer 215. The device layer 211 includes optical devices and electronic devices. Each of the plurality of die 100 has the cladding layer 213 formed below the device layer 211. The cladding layer 213 has a refractive index different than a refractive index of optical waveguides formed within the device layer 211. The cladding layer 213 is formed on the substrate 107 of the wafer 101. Each of the plurality of die 100 includes a respective portion of the substrate 107A. The bottom surface 105A of the substrate portion 107A of each die 100 corresponds to the bottom surface 105 of the wafer 101. The device layer 211 of each of the plurality of die 100 includes the first photonic test port 503A, the second photonic test port 503B, the first normal vertical optical grating coupler 204A, and the second normal vertical optical grating coupler 204B.

Also, for each of the plurality of die 100, a first light transfer region 501A is formed within the wafer 101, with the wafer 101 in the intact configuration. The first light transfer region 501A extends through the top layer 215 to the first photonic test port 503A within the device layer 211. The first light transfer region 501A provides a window for transmission of light into and out of the first photonic test port 503A from and to a location on the top surface 103 of the wafer 101. Also, for each of the plurality of die 100, a second light transfer region 501B is formed within the wafer 101, with the wafer 101 in the intact configuration. The second light transfer region 501B extends through the top layer 215 to the second photonic test port 503B within the device layer 211. The second light transfer region 501B provides a window for transmission of light into and out of the second photonic test port 503B from and to a second location on the top surface 103 of the wafer 101.

In some embodiments, each of the first photonic test port 503A and the second photonic test port 503B is a respective vertical optical grating coupler. In some embodiments, the first photonic test port 503A is switchable with the first normal vertical optical grating coupler 204A within the device layer 211. The first photonic test port 503A enables wafer-level photonic testing of photonic circuitry coupled to the first normal vertical optical grating coupler 204A. The second photonic test port 503B is switchable with the second normal vertical optical grating coupler 204B within the device layer 211. The second photonic test port 503B enables wafer-level photonic testing of photonic circuitry coupled to the second normal vertical optical grating coupler 204B.

In some embodiments, the first normal vertical optical grating coupler 204A is configured to receive incoming light transmitted through the bottom surface 105A of the substrate 107A. Also, the second normal vertical optical grating coupler 204B is configured to transmit outgoing light through the bottom surface 105A of the substrate 107A. In some embodiments, the first photonic test port 503A is configured to receive incoming light transmitted through the first light transfer region 501A from the first location on the top surface 103 of the wafer 101. Also, the second photonic test port 503B is configured to transmit outgoing light through the second light transfer region 501B toward the second location on the top surface 103 of the wafer 101.

In some embodiments, each of the plurality of die 100 includes a first optical switching device 707A that has a first optical port optically connected to an optical input of the photonic circuitry 801 within the device layer 211. The first optical switching device 707A has a second optical port optically connected to the first normal vertical optical grating coupler 204A within the device layer 211. The first optical switching device 707A also has a third optical port optically connected to the first photonic test port 503A within the device layer 211. The first optical switching device 707A is configured to optically connect its third optical port to its first optical port for wafer-level photonic testing. The first optical switching device 707A is configured to optically connect its second optical port to its first optical port for normal die 100 operation. Also, each of the plurality of die 100 includes a second optical switching device 707B that has a first optical port optically connected to an optical output of the photonic circuitry 801 within the device layer 211. The second optical switching device 707B has a second optical port optically connected to the second normal vertical optical grating coupler 204B within the device layer 211. The second optical switching device 707B has a third optical port optically connected to the second photonic test port 503B within the device layer 211. The second optical switching device 707B is configured to optically connect its third optical port to its first optical port for wafer-level photonic testing. The second optical switching device 707B is configured to optically connect its second optical port to its first optical port for normal die 100 operation.

In some embodiments, each of the first optical switching device 707A and the second optical switching device 707B is an active device controllable through electronic signals. In some embodiments, the first optical switching device 707A is configured to default to optical connection of its second optical port to its first optical port for normal die 100 operation, and the second optical switching device 707B is configured to default to optical connection of its second optical port to its first optical port for normal die 100 operation. In some embodiments, the first optical switching device 707A is a passive device initially configured to optically connect its third optical port to its first optical port for wafer-level photonic testing. Also, in these embodiments, the second optical switching device 707B is a passive device initially configured to optically connect its third optical port to its first optical port for wafer-level photonic testing. The first optical switching device 707A is reconfigurable to optically connect its second optical port to its first optical port for normal die 100 operation after wafer-level photonic testing. Also, the second optical switching device 707B is reconfigurable to optically connect its second optical port to its first optical port for normal die 100 operation after wafer-level photonic testing. In some embodiments, the first optical switching device 707A is reconfigured to have a low-loss optical coupling between its second optical port and its first optical port for normal die 100 operation after wafer-level photonic testing. And, the second optical switching device 707B is reconfigured to have a low-loss optical coupling between its second optical port and its first optical port for normal die 100 operation after wafer-level photonic testing.

Figure 9:
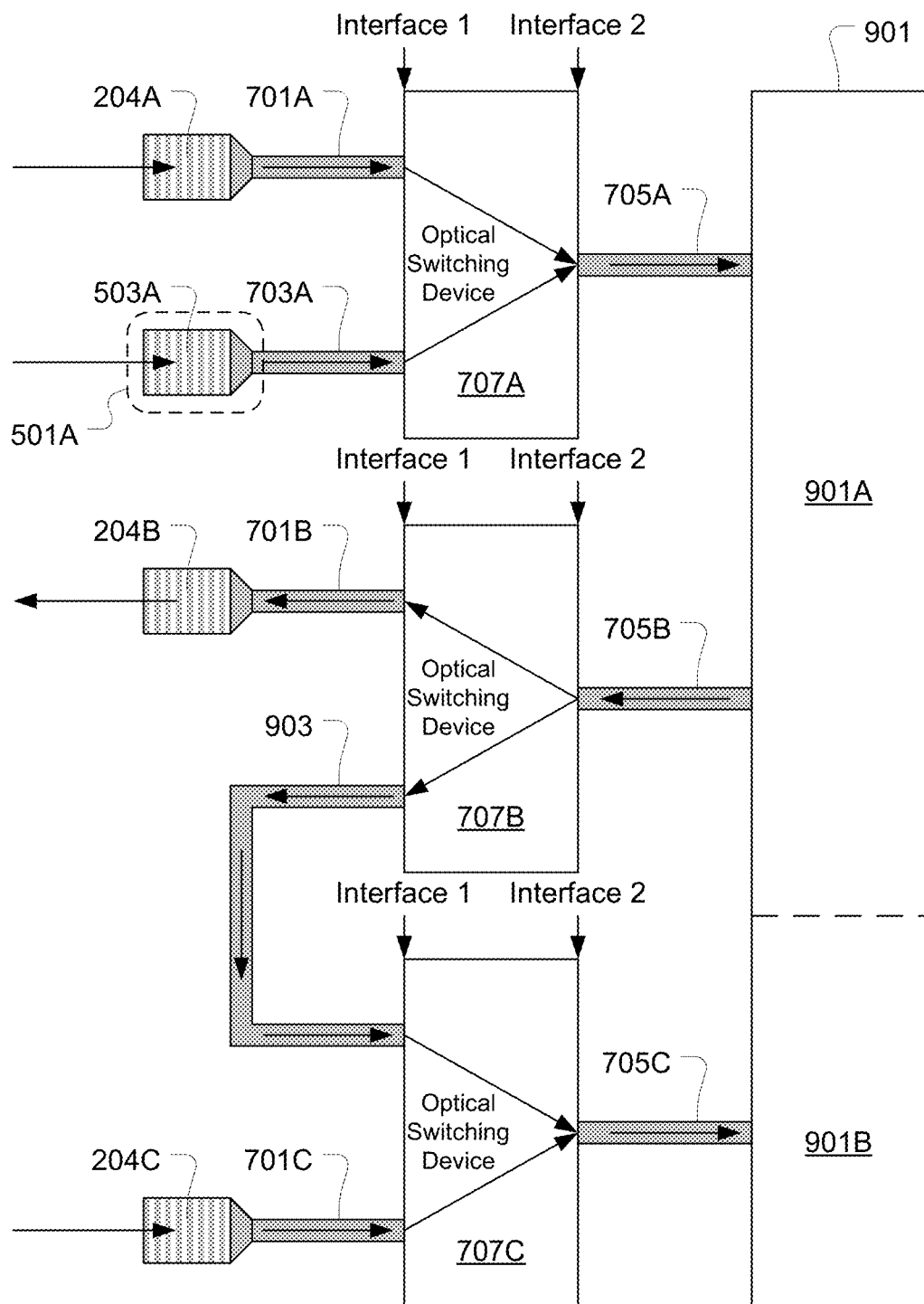
FIG. 9 shows a schematic diagram of a portion of the device layer within the die that includes an optical transceiver, in accordance with some embodiments.

FIG. 9 shows a schematic diagram of a portion of the layer 211 within the die 100 that includes an optical transceiver 901, in accordance with some embodiments. The optical transceiver 901 includes optical transmitter circuitry 901A and optical receiver circuitry 901B. Source light, such as from a laser, enters the optical transmitter circuitry 901A through the optical waveguide 705A, is modulated within the optical transmitter circuitry 901A to represent optical data, and exits the optical transmitter circuitry 901A through the optical waveguide 705B. Also, light representing optical data enters the optical receiver circuitry 901B through an optical waveguide 705C.

As described with regard to FIG. 8, the vertical optical grating coupler 204A is optically connected to the optical waveguide 701A. Again, the description of the vertical optical grating coupler 204 herein is equally applicable to the vertical optical grating coupler 204A. The optical waveguide 701A is optically connected to the first optical input on the first interface of the optical switching device 707A. Similarly, the photonic test port 503A is optically connected to the optical waveguide 703A. The optical waveguide 703A is optically connected to the second optical input on the first interface of the optical switching device 707A. The optical output on the second interface of the optical switching device 707A is optically connected to the optical waveguide 705A. The optical waveguide 705A is optically connected to an optical input port of the optical transmitter circuitry 901A defined within the layer 211 of the die 100. When the die 100 is flip-chip packaged, the optical switching device 707A is configured/controlled to optically connect the vertical optical grating coupler 204A to the optical transmitter circuitry 901A by way of the optical waveguides 701A and 705A. However, when the die 100 is undergoing wafer-level testing as part of the intact wafer 101, the optical switching device 707A is configured/controlled to optically connect the photonic test port 503A to the optical transmitter circuitry 901A by way of the optical waveguides 703A and 705A.

The vertical optical grating coupler 204B is optically connected to the optical waveguide 701B. Again, the description of the vertical optical grating coupler 204 herein is equally applicable to the vertical optical grating coupler 204B. The optical waveguide 701B is optically connected to the first optical output on the first interface of the optical switching device 707B. An optical waveguide 903 is optically connected to the second optical output on the first interface of the optical switching device 707B in a "loopback" configuration. The optical input on the second interface of the optical switching device 707B is optically connected to the optical waveguide 705B. The optical waveguide 705B is optically connected to an optical output port of the optical transmitter circuitry 901A defined within the layer 211 of the die 100. When the die 100 is flip-chip packaged, the optical switching device 707B is configured/controlled to optically connect the vertical optical grating coupler 204B to the optical transmitter circuitry 901A, by way of the optical waveguides 701B and 705B. However, when the die 100 is undergoing wafer-level testing as part of the intact wafer 101, the optical switching device 707B is configured/controlled to optically connect the optical transmitter circuitry 901A to the optical waveguide 903, by way of the optical waveguide 705B.

The optical waveguide 903 is connected to a first optical input on a first interface of an optical switching device 707C. An optical output on a second interface of the optical switching device 707C is optically connected to the optical waveguide 705C. The optical waveguide 705C is optically connected to an optical input port of the optical receiver circuitry 901B. A second optical input on the first interface of the optical switching device 707C is optically connected to an optical waveguide 701C. The optical waveguide 701C is optically connected to a vertical optical grating coupler 204C. The description of the vertical optical grating coupler 204 herein is equally applicable to the vertical optical grating coupler 204C. When the die 100 is undergoing wafer-level testing as part of the intact wafer 101, the optical switching device 707C is configured/controlled to optically connect the optical waveguide 903 to the optical receiver circuitry 901B, by way of the optical waveguide 705C. In this manner, during the wafer-level photonic testing of the die 100, the modulated light that is transmitted from the optical transmitter circuitry 901A is directed through the optical waveguide 705B, through the optical switching device 707B, through the optical waveguide 903, through the optical switching device 707C, and through the optical waveguide 705C to the optical input of the optical receiver circuitry 901B. In this manner, during wafer-level testing of the die 100, control electronics on the die 100 can run built-in self tests (BIST) to verify operation of the optical transmitter circuitry 901A and optical receiver circuitry 901B against each other. When the die 100 is flip-chip packaged, the optical switching device 707C is configured/controlled to optically connect the vertical optical grating coupler 204C to the optical receiver circuitry 901B, by way of the optical waveguides 701C and 705C.

In some embodiments, each of the vertical optical grating couplers 204A, 204B, and 204C is configured to optically couple downward toward the bottom surface 105A of the die 100. In this manner, each of the vertical optical grating couplers 204A and 204C receives incoming light through the substrate 107A and the layer 213. And, the vertical optical grating coupler 204B directs outgoing light through the substrate 107A and the layer 213. In some embodiments, the vertical optical grating couplers 204A, 204B, and 204C are used during normal operation of the die 100 after the die 100 is flip-chip bonded to the package substrate 221, as shown in FIG. 3. In some embodiments, the photonic test port 503A is a vertical optical grating coupler configured to optically couple upward toward the top surface 103A of the die 100. In this manner, the photonic test port 503A receives incoming light through the light transfer region 501. In some embodiments, the photonic test port 503A is used during wafer-level testing of the photonic circuitry 801 on the die 100, such as when the intact wafer 101 is positioned on the chuck 401 of the wafer prober, as shown in FIGS. 5 and 6. In this manner, the photonic test port 503A can be used to supply laser light to the optical transmitter circuitry 901A to enable testing of the optical transmitter circuitry 901A and the optical receiver circuitry 901B across variations in optical power, wavelength, polarization, modulation, and/or other optical parameter(s), in conjunction with use of the wafer prober to perform electrical testing on the die 100 through the electrical contacts 217.

When the die 100 is flip-chip packaged, the optical switching device 707A is configured/controlled to optically connect the vertical optical grating coupler 204A to the optical transmitter circuitry 901A on the die 100 by way of the optical waveguides 701A and 705A, and the optical switching device 707B is configured/controlled to optically connect the vertical optical grating coupler 204B to the optical transmitter circuitry 901A on the die 100 by way of the optical waveguides 701B and 705B, and the optical switching device 707C is configured/controlled to optically connect the vertical optical grating coupler 204C to the optical receiver circuitry 901B on the die 100 by way of the optical waveguides 701C and 705C. However, when the die 100 is undergoing wafer-level testing as part of the intact wafer 101, the optical switching device 707A is configured/controlled to optically connect the photonic test port 503A to the optical transmitter circuitry 901A on the die 100 by way of the optical waveguides 703A and 705A, and the optical switching devices 707B and 707C are configured/controlled to optically connect the optical transmitter circuitry 901A to the optical receiver circuitry 901B, by way of the optical waveguides 705B, 903, and 705C.

In some instances of the embodiment of FIG. 9, the optical switching device 707A is a passive device that includes optical components and that do not require electrical input/control, in the same manner as described herein with regard to the passive device embodiments of the optical switching device 707. In some instances of the embodiment of FIG. 9, the optical switching device 707A is an active device that includes electro-optical components that are electrically controlled, in the same manner as described herein with regard to the active device embodiments of the optical switching device 707. In some instances of the embodiment of FIG. 9, the optical switching device 707B is a passive device that includes optical components and that do not require electrical input/control, in the same manner as described herein with regard to the passive device embodiments of the optical switching device 707. In some instances of the embodiment of FIG. 9, the optical switching device 707B is an active device that includes electro-optical components that are electrically controlled, in the same manner as described herein with regard to the active device embodiments of the optical switching device 707. In some instances of the embodiment of FIG. 9, the optical switching device 707C is a passive device that includes optical components and that do not require electrical input/control, in the same manner as described herein with regard to the passive device embodiments of the optical switching device 707. In some instances of the embodiment of FIG. 9, the optical switching device 707C is an active device that includes electro-optical components that are electrically controlled, in the same manner as described herein with regard to the active device embodiments of the optical switching device 707.

In accordance with the example embodiment of FIG. 9, in some embodiments, the wafer 101 is disclosed to include the plurality of die 100 formed on the wafer 101, with the wafer 101 in an intact configuration. The wafer 101 has the top surface 103 and the bottom surface 105. Each of the plurality of die 100 has the top layer 215 that includes routings of conductive interconnect structures electrically isolated from each other by intervening dielectric material. The top surface 103A of the top layer 215 corresponds to the top surface 103 of the wafer 101. Each of the plurality of die 100 has the device layer 211 located below the top layer 215. The device layer 211 includes optical devices and electronic devices. Each of the plurality of die 100 has the cladding layer 213 formed below the device layer 211. The cladding layer 213 has a refractive index different than a refractive index of optical waveguides formed within the device layer 211. The cladding layer 213 is formed on the substrate 107 of the wafer 101. Each of the plurality of die 100 includes a respective portion of the substrate 107A. The bottom surface 105A of the substrate portion 107A of each die 100 corresponds to the bottom surface 105 of the wafer 101. The device layer 211 of each of the plurality of die 100 includes the photonic test port 503A, the first normal vertical optical grating coupler 204A, the second normal vertical optical grating coupler 204B, and the third normal vertical optical grating coupler 204C.

Also, for each of the plurality of die 100, a light transfer region 501A is formed within the wafer 101, with the wafer 101 in the intact configuration. The light transfer region 501A extends through the top layer 215 to the photonic test port 503A within the device layer 211. The light transfer region 501A provides a window for transmission of light into and out of the photonic test port 503A from and to a location on the top surface 103 of the wafer 101.

Also, for each of the plurality of die 100, the first optical switching device 707A is formed within the device layer 211. The first optical switching device 707A has a first optical port optically connected to an optical input of the photonic transmitter circuitry 901A within the device layer 211. The first optical switching device 707A also has a second optical port optically connected to the first normal vertical optical grating coupler 204A within the device layer 211. The first optical switching device 707A also has a third optical port optically connected to the photonic test port 503A within the device layer 211. The first optical switching device 707A is configured to optically connect its third optical port to its first optical port for wafer-level photonic testing. The first optical switching device 707A is also configured to optically connect its second optical port to its first optical port for normal die 100 operation.

Also, for each of the plurality of die 100, the second optical switching device 707B is formed within the device layer 211. The second optical switching device 707B has a first optical port optically connected to an optical output of the photonic transmitter circuitry 901A within the device layer 211. The second optical switching device 707B also has a second optical port optically connected to the second normal vertical optical grating coupler 204B within the device layer 211. The second optical switching device 707B also has a third optical port optically connected to the optical waveguide 903 within the device layer 211. The second optical switching device 707B is configured to optically connect its third optical port to its first optical port for wafer-level photonic testing. The second optical switching device 707B is also configured to optically connect its second optical port to its first optical port for normal die 100 operation.

Also, for each of the plurality of die 100, the third optical switching device 707C is formed within the device layer 211. The third optical switching device 707C has a first optical port optically connected to an optical input of the photonic receiver circuitry 901B within the device layer 211. The third optical switching device 707C also has a second optical port optically connected to the third normal vertical optical grating coupler 204C within the device layer 211. The third optical switching device 707C also has a third optical port optically connected to the optical waveguide 903 within the device layer 211. The third optical switching device 707C is configured to optically connect its third optical port to its first optical port for wafer-level photonic testing so that modulated light transmitted through the optical output of the photonic transmitter circuitry 901A is transmitted through the optical waveguide 903 to the optical input of the photonic receiver circuitry 901B during wafer-level photonic testing. The third optical switching device 707C is also configured to optically connect its second optical port to its first optical port for normal die 100 operation.

In some embodiments, the photonic test port 503A is a respective vertical optical grating coupler. In some embodiments, the first normal vertical optical grating coupler 204A is configured to receive incoming light transmitted through the bottom surface 105A of the substrate 107A. Also, in these embodiments, the second normal vertical optical grating coupler 204B is configured to transmit outgoing light through the bottom surface 105A of the substrate 107A. Also, in these embodiments, the third normal vertical optical grating coupler 204C is configured to receive incoming light transmitted through the bottom surface 105A of the substrate 107A. In some embodiments, the photonic test port 503A is configured to receive incoming light transmitted through the light transfer region 501A from the location on the top surface of the wafer 101.

In some embodiments, each of the first optical switching device 707A, the second optical switching device 707B, and the third optical switching device 707C is an active device controllable through electronic signals. In some embodiments, the first optical switching device 707A is configured to default to optical connection of its second optical port to its first optical port for normal die 100 operation. Also, the second optical switching device 707B is configured to default to optical connection of its second optical port to its first optical port for normal die 100 operation. Also, the third optical switching device 707C is configured to default to optical connection of its second optical port to its first optical port for normal die 100 operation.

In some embodiments, the first optical switching device 707A is a passive device initially configured to optically connect its third optical port to its first optical port for wafer-level photonic testing. Also, the second optical switching device 707B is a passive device initially configured to optically connect its third optical port to its first optical port for wafer-level photonic testing. Also, the third optical switching device 707C is a passive device initially configured to optically connect its third optical port to its first optical port for wafer-level photonic testing. In these embodiments, the first optical switching device 707A is reconfigurable to optically connect its second optical port to its first optical port for normal die 100 operation after wafer-level photonic testing. Also, the second optical switching device 707B is reconfigurable to optically connect its second optical port to its first optical port for normal die 100 operation after wafer-level photonic testing. Also, the third optical switching device 707C is reconfigurable to optically connect its second optical port to its first optical port for normal die 100 operation after wafer-level photonic testing.

Figure 10:
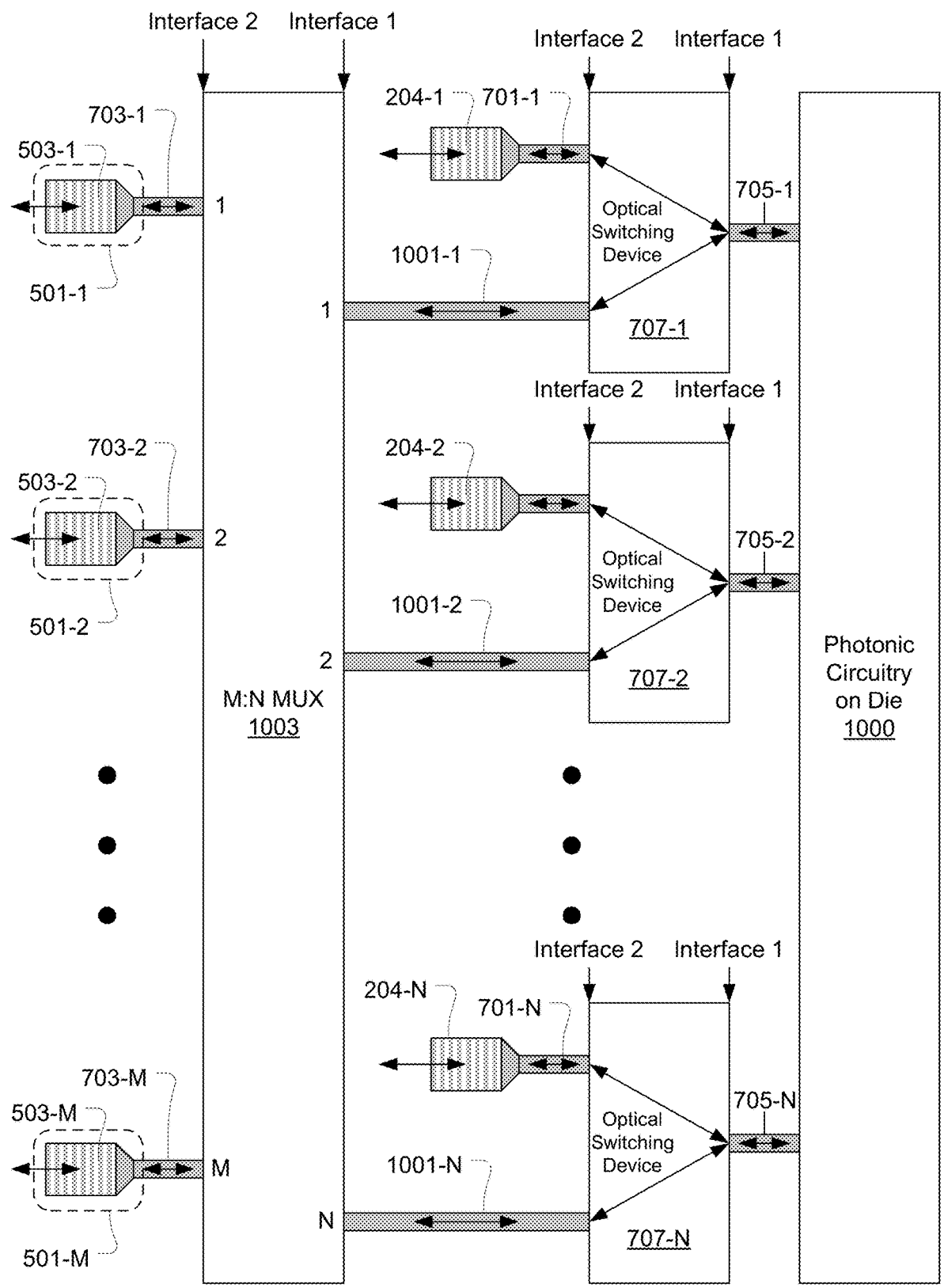
FIG. 10 shows a schematic diagram of a portion of the device layer within the die that includes photonic circuitry switchably connected to optical input/output ports defined as vertical optical grating couplers and photonic test ports, in accordance with some embodiments of the present invention.

FIG. 10 shows a schematic diagram of a portion of the layer 211 within the die 100 that includes photonic circuitry 1000 switchably connected to optical input/output ports defined as vertical optical grating couplers 204-1 through 204-N and photonic test ports 503-1 through 503-M, in accordance with some embodiments of the present invention. The description of the vertical optical grating coupler 204 herein is equally applicable to each of the vertical optical grating couplers 204-1 through 204-N. In various embodiments, the photonic circuitry 1000 can include any type of photonic device and any combination of photonic devices. In some embodiments, the photonic circuitry 1000 includes a single photonic circuit. In some embodiments, the photonic circuitry 1000 includes multiple photonic circuits. The photonic circuitry 1000 includes a number (N) of optical input/output ports connected to optical waveguides 705-1 through 705-N, where N is greater than 1. Each of the optical waveguides 705-1 through 705-N is optically connected to a first optical input/output port on a first interface of a corresponding one of the optical switching devices 707-1 through 707-N, respectively. Each optical switching device 707-1 through 707-N has a second optical input/output port on a second interface optically connected to an optical waveguide 701-1 through 701-N, respectively. Each optical waveguide 701-1 through 701-N is optically connected to a corresponding one of vertical optical grating couplers 204-1 through 204-N. Each optical switching device 707-1 through 707-N has a third optical input/output port on the second interface optically connected to an optical waveguide 1001-1 through 1001-N, respectively. The optical waveguides 1001-1 through 1001-N are optically connected to (N) corresponding optical input/output ports on a first interface of an M-to-N (M:N) optical multiplexer (MUX) 1003. The MUX 1003 includes an additional number (M) of optical input/output ports on a second interface optically connected to corresponding optical waveguides 703-1 through 703-N. The optical waveguides 703-1 through 703-N are optically connected to corresponding photonic test ports 503-1 through 503-M.

Each of the optical switching devices 707-1 through 707-N is configured to control optical connection to the optical waveguides 705-1 through 705-N, respectively. More specifically, at a given time, each of the optical switching devices 707-*x* (where x is any one of 1 to N) is configured to either optically connect the optical waveguide 701-*x* to the optical waveguide 705-*x*, or optically connect the optical waveguide 1001-*x* to the optical waveguide 705-*x*. In this manner, at a given time, each optical switch device 707-*x* functions to optically connect the optical waveguide 705-*x* to either the vertical optical grating coupler 204-*x* or the optical waveguide 1001-*x*. In some embodiments, one or more of the optical switching devices 707-1 through 707-N is a passive device that includes optical components and that do not require electrical input/control, in the same manner as described herein with regard to the passive device embodiments of the optical switching device 707. In some embodiments, one or more of the optical switching devices 707-1 through 707-N is an active device that includes electro-optical components that are electrically controlled, in the same manner as described herein with regard to the active device embodiments of the optical switching device 707.

The MUX 1003 is configured to optically connect any one or more of the N optical input/output ports on the first interface of the MUX 1003 to any one or more of the M optical input/output ports on the second interface of the MUX 1003. In this manner, at a given time, the MUX 1003 functions to optically connect any one or more of the photonic test ports 503-1 through 503-M to any one or more of the optical waveguides 1001-1 through 1001-N. In some embodiments, the MUX 1003 is implemented as an optical switch. In some embodiments, the MUX 1003 is implemented as a passive optical splitter/combiner. In some embodiments, the number M of optical input/output ports on the second interface of the MUX 1003 is reduced in order to reduce a number of optical fiber alignments with the die 100 during the wafer-level testing of the die 100. In some embodiments, the number M of optical input/output ports on the second interface of the MUX 1003 is one. In some embodiments, the number M of optical input/output ports on the second interface of the MUX 1003 is greater than one.

With a given optical switching device 707-*x* operating to optically connect a corresponding optical input/output of the photonic circuitry 1000 to the corresponding optical waveguide 1001-*x*, the MUX 1003 can be operated to connect the corresponding optical waveguide 1001-*x* to any one or more of the photonic test ports 503-*y* (where y is any one of 1 to M) by way of the corresponding optical waveguide 703-*y*. Therefore, during photonic testing of the die 100, the MUX 1003 and the optical switching devices 707-1 through 707-N can be controlled to establish optical connectivity between any one or more optical input/output port(s) of the photonic circuitry 1000 and any one or more of the photonic test ports 503-1 through 503-M. And, during normal operation of the die 100, the optical switching devices 707-1 through 707-N can be controlled to establish optical connectivity between any one or more optical input/output port(s) of the photonic circuitry 1000 and its corresponding vertical optical grating coupler 204-*x*.

In some embodiments, the MUX 1003 is an optical switching device controlled either directly by the wafer prober or indirectly by electronic controls on the die 100. In some embodiments, the wafer prober is controlled to scan through the MUX 1003 to optically and electro-optically characterize the photonic circuitry 1000 and/or sub-circuits of the photonic circuitry 1000 on the die 100. In some embodiments, the MUX 1003 is configured as a set of S multiplexers that collectively reduce the N optical input/output ports on the first interface of the MUX 1003 to the M optical input/output ports on the second interface of the MUX 1003. For example, with the MUX 1003 configured as a set of two multiplexers (S=2), a number (A) of optical input ports of the photonic circuitry 1000 can be optically routed to a first of the two multiplexers of the MUX 1003, and a number (B) of optical output ports of the photonic circuitry 1000 can be optically routed to a second of the two multiplexers of the MUX 1003, where A+B=N. In this example, some of the M input/output ports on the second interface of the MUX 1003 will be part of the first of the two multiplexers of the MUX 1003, and a remainder of the M input/output ports on the second interface of the MUX 1003 will be part of the second of the two multiplexers of the MUX 1003.

In some embodiments, each of the vertical optical grating couplers 204-1 through 204-N is configured to optically couple downward toward the bottom surface 105A of the die 100. In this manner, each of the vertical optical grating couplers 204-1 through 204-N receives incoming light through the substrate 107A and the layer 213 and directs outgoing light through the substrate 107A and the layer 213. In some embodiments, the vertical optical grating couplers 204-1 through 204-N are used during normal operation of the die 100 after the die 100 is flip-chip bonded to the package substrate 221, as shown in FIG. 3. Thus, in these embodiments, when the die 100 is flip-chip packaged, the optical switching devices 707-1 through 707-N are controlled to establish optical connectivity between any one or more optical input/output port(s) of the photonic circuitry 1000 and its corresponding vertical optical grating coupler 204-*x*.

In some embodiments, each of the photonic test ports 503-1 through 503-M is a vertical optical grating coupler configured to optically couple upward toward the top surface 103A of the die 100. In this manner, each of the photonic test ports 503-1 through 503-M receives incoming light through the light transfer region 501. In some embodiments, each of the photonic test ports 503-1 through 503-M is used during wafer-level testing of the photonic circuitry 1000 on the die 100, such as when the intact wafer 101 is positioned on the chuck 401 of the wafer prober, as shown in FIGS. 5 and 6. Thus, in these embodiments, when the die 100 is undergoing wafer-level testing as part of the intact wafer 101, the MUX 1003 and the optical switching devices 707-1 through 707-N are controlled to establish optical connectivity between any one or more optical input/output port(s) of the photonic circuitry 1000 and any one or more of the photonic test ports 503-1 through 503-M.

In accordance with the example embodiment of FIG. 10, in some embodiments, the wafer 101 is disclosed to include the plurality of die 100 formed on the wafer 101, with the wafer 101 in an intact configuration. The wafer 101 has the top surface 103 and the bottom surface 105. Each of the plurality of die 100 has the top layer 215 that includes routings of conductive interconnect structures electrically isolated from each other by intervening dielectric material. The top surface 103A of the top layer 215 corresponds to the top surface 103 of the wafer 101. Each of the plurality of die 100 has the device layer 211 located below the top layer 215. The device layer 211 includes optical devices and electronic devices. Each of the plurality of die 100 has the cladding layer 213 formed below the device layer 211. The cladding layer 213 has a refractive index different than a refractive index of optical waveguides formed within the device layer 211. The cladding layer 213 is formed on the substrate 107 of the wafer 101. Each of the plurality of die 100 includes a respective portion of the substrate 107A. The bottom surface 105A of the substrate portion 107A of each die 100 corresponds to the bottom surface 105 of the wafer 101.

For each of the plurality of die 100, the photonic circuitry 1000 is formed within the device layer 211. The photonic circuitry 1000 has the number (N) of optical ports (input/output ports). Also, for each of the plurality of die 100, the number N of normal vertical optical grating couplers 204-1 through 204-N are formed within the device layer 211. Also, for each of the plurality of die 100, the number N of optical switching devices 707-1 through 707-N are formed within the device layer 211. Each optical switching device 707-1 through 707-N has a first optical port optically connected to a respective one of the number N of optical ports of the photonic circuitry 1000. Also, each optical switching device 707-1 through 707-N has a second optical port optically connected to a respective one of the number N of normal vertical optical grating couplers 204-1 through 204-N. Also, each optical switching device 707-1 through 707-N has a third optical port. Also, for each of the plurality of die 100, the number N of optical waveguides 1001-1 through 1001-N are formed within the device layer 211. Each of the number N of optical waveguides 1001-1 through 1001-N is optically connected to the third optical port of a respective one of the number N of optical switching devices 707-1 through 707-N.

For each of the plurality of die 100, the optical multiplexer 1003 is formed within the device layer 211. The optical multiplexer 1003 has the first interface that includes the number N of optical ports (input/output ports). Each optical port of the first interface of the optical multiplexer 1003 is optically connected to a respective one of the number N of optical waveguides 1001-1 through 1001-N. The optical multiplexer 1003 also has the second interface that includes the number (M) of optical ports (input/output ports). The optical multiplexer 1003 is programmable to optically connect any one or more of the number N of optical ports of the first interface to any one or more of the number M of optical ports of the second interface at a given time. Also, for each of the plurality of die 100, the number M of photonic test ports 503-1 through 503-M are formed within the device layer 211. Each of the number M of photonic test ports 503-1 through 503-M is optically connected to a respective one of the number M of optical ports of the second interface of the optical multiplexer 1003.

For each of the plurality of die 100, the number M of light transfer regions 501-1 through 501-M are formed within the wafer 101, with the wafer 101 in the intact configuration. Each of the number M of light transfer regions 501-1 through 501-M extends through the top layer 215 to a respective one of the number M of photonic test ports 503-1 through 503-M within the device layer 211. Each of the number M of light transfer regions 501-1 through 501-M provides a window for transmission of light into and out of the respective one of the number M of photonic test ports 503-1 through 503-M from and to a respective location on the top surface 103 of the wafer 101.

In some embodiments, each of the number M of photonic test ports 503-1 through 503-M is a respective vertical optical grating coupler. In some embodiments, each of the number N of normal vertical optical grating couplers 204-1 through 204-N is configured to receive incoming light transmitted through the bottom surface 105A of the substrate 107A. Also, each of the number N of normal vertical optical grating couplers 204-1 through 204-N is configured to transmit outgoing light through the bottom surface 105A of the substrate 107A. In some embodiments, each of the number M of photonic test ports 503-1 through 503-M is configured to receive incoming light transmitted through the respective one of the number M of light transfer regions 501-1 through 501-M at the respective location on the top surface 103 of the wafer 101. Also, each of the number M of photonic test ports 503-1 through 503-M is configured to transmit outgoing light through the respective one of the number M of light transfer regions 501-1 through 501-M at the respective location on the top surface 103 of the wafer 101.

In some embodiments, each of the number N of optical switching devices 707-1 through 707-N is an active device controllable through electronic signals. In some embodiments, each of the number N of optical switching devices 707-1 through 707-N is configured to default to optical connection of its second optical port to its first optical port for normal die 100 operation. In some embodiments, each of the number N of optical switching devices 707-1 through 707-N is a passive device initially configured to optically connect its third optical port to its first optical port for wafer-level photonic testing. Also, in these embodiments, each of the number N of optical switching devices 707-1 through 707-N is reconfigurable to optically connect its second optical port to its first optical port for normal die 100 operation after wafer-level photonic testing. Also, in some embodiments, the optical multiplexer 1003 and the number M of photonic test ports 503-1 through 503-M are formed in the kerf region between neighboring die 100 on the wafer 101.

FIG. 11 shows a flowchart of a method for enabling wafer-level photonic testing, in accordance with some embodiments. The method includes an operation 1101 for having the wafer 101 that includes the plurality of die 100 formed on the wafer 101, with the wafer 101 in the intact configuration. The wafer 101 has the top surface 103 and the bottom surface 105. Each of the plurality of die 100 has the top layer 215 that includes routings of conductive interconnect structures electrically isolated from each other by intervening dielectric material. The top surface 103A of the top layer 215 corresponds to the top surface 103 of the wafer 101. Each of the plurality of die 100 has the device layer 211 located below the top layer 215. The device layer 211 includes optical devices and electronic devices. Each of the plurality of die 100 has the cladding layer 213 formed below the device layer 211. The cladding layer 213 has a refractive index different than a refractive index of optical waveguides formed within the device layer 211. The cladding layer 213 is formed on the substrate 107 of the wafer 101. Each of the plurality of die 100 includes a respective portion of the substrate 107A. The bottom surface 105A of the substrate portion 107A of each die 100 corresponds to the bottom surface 105 of the wafer 101. Each of the plurality of die 100 includes the photonic test port 503 formed within the device layer 211. The method also includes an operation 1103 for forming the light transfer region 501 within the wafer 101, with the wafer 101 in the intact configuration. The light transfer region 501 is formed to extend through the top layer 215 to the photonic test port 503 within the device layer 211. The light transfer region 501 provides a window for transmission of light into and out of the photonic test port 503 from and to a location on the top surface 103 of the wafer 101.

In some embodiments of the method, the photonic test port 503 is a vertical optical grating coupler switchable with the normal vertical optical grating coupler 204 within the device layer 211. In some embodiments, the method includes switching the photonic test port 503 for the normal vertical optical grating coupler 204, so that the photonic test port 503 is optically coupled to photonic devices to be tested. In some embodiments of the method, the normal vertical optical grating coupler 204 is configured to receive incoming light transmitted through the bottom surface 105A of the substrate 107A. Also, the normal vertical optical grating coupler 204 is configured to transmit outgoing light through the bottom surface 105A of the substrate 107A. And, in some embodiments of the method, the photonic test port 503 is configured to receive incoming light transmitted through the light transfer region 501 from the location on the top surface 103 of the wafer 101. Also, the photonic test port 503 is configured to transmit outgoing light through the light transfer region 501 toward the location on the top surface 103 of the wafer 101.

In some embodiments of the method, each of the plurality of die 100 includes the optical switching device 707 that has the first optical port optically connected to the optical circuit within the device layer 211. Also, the optical switching device 707 has the second optical port optically connected to the normal vertical optical grating coupler 204 within the device layer 211. Also, the optical switching device 707 has the third optical port optically connected to the photonic test port 503 within the device layer 211. The method includes setting the optical switching device 707 to optically connect the third optical port to the first optical port for wafer-level photonic testing. The method also includes setting the optical switching device 707 to optically connect the second optical port to the first optical port for normal die 100 operation. In some embodiments, the method includes controlling the optical switching device 707 through electronic signals. In some embodiments, the method includes having the optical switching device 707 default to optical connection of the second optical port to the first optical port for normal die 100 operation.

In some embodiments of the method, the optical switching device 707 is a passive device initially configured to optically connect of the third optical port to the first optical port for wafer-level photonic testing. In some embodiments, the method includes reconfiguring the optical switching device 707 to optically connect of the second optical port to the first optical port for normal die 100 operation after wafer-level photonic testing. In some embodiments of the method, the optical switching device 707 is reconfigured to have a low-loss optical coupling between the second optical port and the first optical port for normal die 100 operation after wafer-level photonic testing. In some embodiments of the method, the low-loss optical coupling is implemented by a shift in optical phase velocity within one or more optical waveguides within the optical switching device 707. In some embodiments of the method, reconfiguring the optical switching device 707 is done as part of a handle release process, where the handle release process is performed to remove a handle structure from the bottom 105 of the wafer 101.

In some embodiments of the method, the light transfer region 501 is formed as a region of the top layer 215 that does not include metal, where a material of the top layer 215 within the light transfer region 501 allows for transmission of light. In some embodiments of the method, the light transfer region 501 is formed of a material that allows transmission of light into and out of the photonic test port 503. In some embodiments of the method, the light transfer region 501 is formed as an open region in the top layer 215 to expose the photonic test port 503. In some embodiments, the method includes filling the light transfer region 501 with a light blocking material after completion of the wafer-level photonic testing.

The light transfer region 501 and the photonic test port 503 collectively enable wafer-level photonic testing of a corresponding one of the plurality of die 100 in conjunction with wafer-level electrical testing of the corresponding one of the plurality of die 100 when the bottom surface 105 of the wafer 101 is positioned on a chuck of a wafer prober. In some embodiments of the method, the light transfer region 501 and the photonic test port 503 are formed in a kerf region between neighboring die 100 on the wafer 101. In some embodiments of the method, a reflective interface is formed at a top surface of the substrate 107. The reflective interface is formed to reflect light traveling in a direction toward the substrate 107 from the top surface 103 of the wafer 101. In some embodiments of the method, the reflective interface redirects light traveling from the light transfer region 501 to the top surface of the substrate 107 back into the photonic test port 503.

It should be understood that the method of FIG. 11 can be performed to measure the electro-optic response of the photonic circuitry on the die 100 across variations in optical power, wavelength, polarization, modulation, and/or other optical parameter(s), in conjunction with use of a wafer prober to perform electrical testing on the die 100. Therefore, the method of FIG. 11 provides for simultaneous electronic and photonic testing of the die 100 on the intact wafer 101, even when the bottom of the substrate 107 of the wafer 101 is obscured/blocked by a chuck of the wafer prober.

The foregoing description of the embodiments has been provided for purposes of illustration and description. It is not intended to be exhaustive or to limit the invention. Individual elements or features of a particular embodiment are generally not limited to that particular embodiment, but, where applicable, are interchangeable and/or combinable with features of another embodiment, even if not specifically shown or described. The same may also be varied in many ways. Such variations are not to be regarded as a departure from the invention, and all such modifications are intended to be included within the scope of the invention.

Although the foregoing disclosure includes some detail for purposes of clarity of understanding, it will be apparent that certain changes and modifications can be practiced within the scope of the appended claims. For example, it should be understood that one or more features from any embodiment disclosed herein may be combined with one or more features of any other embodiment disclosed herein. Accordingly, the present embodiments are to be considered as illustrative and not restrictive, and what is claimed is not to be limited to the details given herein, but may be modified within the scope and equivalents of the described embodiments.

What is claimed is:

1. A semiconductor wafer, comprising:
a die including a device layer and a top layer formed over the device layer, the top layer having a substantially planar top surface on which a plurality of electrical contacts are exposed, the device layer formed over an optically reflective substrate with a cladding layer disposed between the device layer and the optically reflective substrate, the device layer including an optical device optically connected to a photonic test port, wherein the top layer includes a light transfer region configured to provide a window for optical coupling with the photonic test port from a location outside of the semiconductor wafer.

2. The semiconductor wafer as recited in claim 1, wherein the light transfer region is a region of the top layer controlled to not include metal, and wherein a material of the top layer within the light transfer region allows for transmission of light.

3. The semiconductor wafer as recited in claim 1, wherein the light transfer region is an open region formed in the top layer to expose the photonic test port.

4. The semiconductor wafer as recited in claim 1, wherein at least a portion of the light transfer region and at least a portion of the photonic test port are formed in a kerf region along a side of the die.

5. The semiconductor wafer as recited in claim 1, wherein the die includes a normal optical port and an optical switch, the optical switch having a first optical input optically connected to the photonic test port and a second optical input optically connected to the normal optical port, the optical switch having an optical output optically connected to the optical device, the optical switch configured to optically connect one of the photonic test port and the normal optical port to the optical output of the optical switch at a given time.

6. The semiconductor wafer as recited in claim 5, wherein the normal optical port is configured to optically couple through the optically reflective substrate.

7. The semiconductor wafer as recited in claim 5, wherein the optical switch is controllable through electronic signals.

8. The semiconductor wafer as recited in claim 5, wherein the optical output port is optically connected to optical receiver circuitry within the device layer.

9. The semiconductor wafer as recited in claim 8, wherein said optical switch is a first optical switch, the device layer including optical transmitter circuitry connected to the optical receiver circuitry, the device layer including a second optical switch having an optical input, a first optical output, and a second optical output, the optical input of the second optical switch optically connected to the optical transmitter circuitry, wherein said photonic test port is a first photonic test port, wherein said normal optical port is a first normal optical port, the device layer including a second photonic test port and a second normal optical port, the first optical output of the second optical switch optically connected to the second photonic test port, the second optical output of the second optical switch optically connected to the second normal optical port, the second optical switch configured to optically connect one of the second photonic test port and the second normal optical port to the optical input of the second optical switch at a given time.

10. The semiconductor wafer as recited in claim 9, wherein each of the first normal optical port and the second normal optical port is configured to optically couple through the optically reflective substrate.

11. The semiconductor wafer as recited in claim 9, wherein the first optical switch is controllable through a first electronic signal and the second optical switch is controllable through a second electronic signal.

12. The semiconductor wafer as recited in claim 8, wherein said optical switch is a first optical switch, the device layer including optical transmitter circuitry connected to the optical receiver circuitry, the device layer including a second optical switch having an optical input, a first optical output, and a second optical output, the optical input of the second optical switch optically connected to the optical transmitter circuitry, wherein said normal optical port is a first normal optical port, the device layer including a second normal optical port and an optical waveguide, the first optical output of the second optical switch optically connected to the second normal optical port, the second optical output of the second optical switch optically connected to the optical waveguide, the second optical switch configured to optically connect one of the second normal optical port and the optical waveguide to the optical input of the second optical switch at a given time.

13. The semiconductor wafer as recited in claim 12, wherein the device layer includes a third optical switch having a first optical input, a second optical input, and an optical output, the device layer including a third normal optical port, the first optical input of the third optical switch optically connected to the optical waveguide, the second optical input of the third optical switch optically connected to the third normal optical port, the third optical switch configured to optically connect one of the optical waveguide and the third normal optical port to the optical output of the third optical switch at a given time.

14. The semiconductor wafer as recited in claim 1, wherein the device layer includes a plurality of photonic test ports, wherein said photonic test port is one of the plurality of photonic test ports, the device layer including an optical multiplexer having a first plurality of optical ports respectively optically connected to the plurality of photonic test ports, the optical multiplexer having a second plurality of optical ports, the device layer including a plurality of optical switches, each of the plurality of optical switches having a first optical port, a second optical port, and a third optical port, each of the plurality of optical switches configured to optically connect one of its first optical port and its second optical port to its third optical port at a given time, the device layer including a plurality of normal optical ports respectively optically connected to the first optical ports of the plurality of optical switches, the second plurality of optical ports of the optical multiplexer respectively optically connected to the second optical ports of the plurality of optical switches, the third optical ports of the plurality of optical switches optically connected to photonic circuitry within the device layer.

15. The semiconductor wafer as recited in claim 14, wherein each of the plurality of normal optical ports is configured to optically couple through the optically reflective substrate.

16. The semiconductor wafer as recited in claim 14, wherein each of the plurality of optical switches is controllable by a corresponding electronic signal.

17. The semiconductor wafer as recited in claim 1, wherein the device layer includes electrical devices.

* * * * *